(12) United States Patent
Oshima

(10) Patent No.: US 9,140,752 B2
(45) Date of Patent: Sep. 22, 2015

(54) TESTER HARDWARE

(71) Applicant: ADVANTEST CORPORATION, Tokyo (JP)

(72) Inventor: Hiromi Oshima, Tokyo (JP)

(73) Assignee: ADVANTEST CORPORATION (JP)

( * ) Notice: Subject to any disclaimer, the term of this patent is extended or adjusted under 35 U.S.C. 154(b) by 122 days.

(21) Appl. No.: 13/908,876

(22) Filed: Jun. 3, 2013

(65) Prior Publication Data

US 2013/0326299 A1 Dec. 5, 2013

(30) Foreign Application Priority Data

Jun. 4, 2012 (JP) .................................. 2012-127525

(51) Int. Cl.
*G01R 31/28* (2006.01)
*G01R 31/3177* (2006.01)
*G01R 31/3183* (2006.01)
*G11C 29/56* (2006.01)
*G01R 31/319* (2006.01)

(52) U.S. Cl.
CPC ...... *G01R 31/3177* (2013.01); *G01R 31/31924* (2013.01); *G01R 31/318371* (2013.01); *G11C 29/56004* (2013.01); *G01R 31/31919* (2013.01)

(58) Field of Classification Search
CPC ..................... G01R 31/3177; G01R 31/31917; G01R 31/31924; G01R 31/31922
USPC .................. 714/718, 724, 735, 742
See application file for complete search history.

(56) References Cited

U.S. PATENT DOCUMENTS

| 5,861,882 A | | 1/1999 | Sprenger et al. |
| 5,996,102 A | * | 11/1999 | Haulin ......................... 714/740 |
| 6,449,741 B1 | | 9/2002 | Organ et al. |
| 6,477,672 B1 | * | 11/2002 | Satoh ............................ 714/721 |
| 6,877,118 B2 | * | 4/2005 | Oshima et al. ................ 714/719 |

(Continued)

FOREIGN PATENT DOCUMENTS

| CN | 1828325 | 9/2006 |
| JP | 60-145634 A | 8/1985 |

(Continued)

OTHER PUBLICATIONS

International Search Report with Written Opinion of ISA for relating PCT Application Nos. PCT/JP2013/003291 mailed on Aug. 27, 2013 with English translation done by the clients.

(Continued)

*Primary Examiner* — Shelly A Chase
(74) *Attorney, Agent, or Firm* — Cantor Colburn LLP

(57) ABSTRACT

A server stores multiple configuration data. A tester hardware is configured to be capable of changing at least a part of its functions according to configuration data stored in rewritable nonvolatile memory, to supply a power supply voltage to a DUT, to transmit a signal to the DUT, and to receive a signal from the DUT. An information technology equipment is configured such that, (i) when the test system is set up, the information technology equipment acquires the configuration data from the server according to the user's input, and writes the configuration data to the nonvolatile memory. Furthermore, the information technology equipment is configured such that, (ii) when the DUT is tested, the information technology equipment executes a test program so as to control the tester hardware, and to process data acquired by the tester hardware.

16 Claims, 11 Drawing Sheets

(56) References Cited

U.S. PATENT DOCUMENTS

| | | |
|---|---|---|
| 7,526,535 B2 | 4/2009 | Peck et al. |
| 7,627,695 B2 | 12/2009 | Peck et al. |
| 2004/0193990 A1 | 9/2004 | Ichiyoshi |
| 2004/0210798 A1 | 10/2004 | Higashi |
| 2004/0225465 A1 | 11/2004 | Pramanick et al. |
| 2006/0271327 A1 | 11/2006 | Haggerty |
| 2007/0022351 A1 | 1/2007 | Zhou et al. |
| 2010/0204949 A1 | 8/2010 | Chang |
| 2011/0158103 A1 | 6/2011 | Hiraide |
| 2011/0184687 A1 | 7/2011 | Morita et al. |

FOREIGN PATENT DOCUMENTS

| | | |
|---|---|---|
| JP | 9-145788 | 6/1997 |
| JP | 10-253714 | 9/1998 |
| JP | 11-64469 | 3/1999 |
| JP | 11-304879 A | 11/1999 |
| JP | 2002-040102 | 2/2002 |
| JP | 2002-208886 | 7/2002 |
| JP | 2003-140895 | 5/2003 |
| JP | 2004-037086 | 2/2004 |
| JP | 2004-37278 | 2/2004 |
| JP | 2005-301370 | 10/2005 |
| JP | 2005-341424 | 12/2005 |
| JP | 2006-003239 A | 1/2006 |
| JP | 2006-162285 A | 6/2006 |
| JP | 2006-242638 | 9/2006 |
| JP | 2007-19992 | 1/2007 |
| JP | 2007-057355 | 3/2007 |
| JP | 2007-528994 | 10/2007 |
| JP | 2008-14784 | 1/2008 |
| JP | 2008-145266 | 6/2008 |
| JP | 2009-198291 | 9/2009 |
| JP | 2010-004139 | 1/2010 |
| JP | 2010-011255 | 7/2010 |
| JP | 2010-177897 | 8/2010 |
| JP | 2010-203937 | 9/2010 |
| JP | 2011-154025 A | 8/2011 |
| JP | 2011-247589 | 12/2011 |
| TW | I287639 B | 10/2007 |
| TW | 201030351 | 8/2010 |
| TW | M397528 | 2/2011 |
| TW | 201135258 A | 10/2011 |
| TW | 201140094 | 10/2011 |
| WO | 2004-088339 | 10/2004 |
| WO | 2005114241 | 12/2005 |
| WO | 2007/132577 | 11/2007 |

OTHER PUBLICATIONS

International Search Report with Written Opinion of ISA for relating PCT Application Nos. PCT/JP2013/003292 mailed on Aug. 27, 2013 with English translation done by the clients.
PCT/JP2013/004383 mailed on Oct. 29, 2013 with English translation done by the clients.
Office action dated Jul. 22, 2014 from corresponding Japanese Patent Application No. 2012-127525 and its English summary provided by the applicant.
Office action dated Aug. 1, 2014 from corresponding Taiwanese Patent Application No. 102113865 and its English summary provided by the applicant.
Office action dated Aug. 1, 2014 from corresponding Taiwanese Patent Application No. 102113866 and its English summary provided by the applicant.
Office action dated Oct. 1, 2014 from related Taiwanese Patent Application Nos. 102119245 and 102119246 and its English summaries provided by the applicant.
ISR for related PCT/JP2013/002528 mailed on Jul. 16, 2013 and ISR for related PCT/JP2013/002527 mailed on Jul. 16, 2013, and their English translations.
Office Action dated Feb. 3, 2015 issued for relating Japanese Patent Application No. 2012-190589 with its English translation from the applicants.
Office Action dated Mar. 3, 2015 issued for relating Japanese Patent Application No. 2012-127525 with its English translation from the applicants.
IPRP dated Mar. 3, 2015 issued for relating PCT Application No. PCT/JP2013/004383 and its English translation.
Office Action issued for relating Japanese Patent Application No. 2012-127526 issued on Dec. 9, 2014 with its English translation.
International Preliminary Examination Report on Patentability (I) with Written Opinion of ISA dated Dec. 9, 2014 for related PCT Application Nos. PCT/JP2013/003291 with an English translation.
International Preliminary Examination Report on Patentability (I) with Written Opinion of ISA dated Dec. 9, 2014 for related PCT Application Nos. PCT/JP2013/003292 with an English translation.
International Preliminary Examination Report on Patentability (I) with Written Opinion of ISA dated Dec. 9, 2014 for related PCT Application Nos. PCT/JP2013/002527 with an English translation.
International Preliminary Examination Report on Patentability (I) with Written Opinion of ISA dated Dec. 9, 2014 for related PCT Application Nos. PCT/JP2013/002528 with an English translation.
Office Action dated Mar. 24, 2015 issued for related Japanese Patent Application No. 2012-127523 and its English translation provided by clients.
Office Action dated Mar. 24, 2015 issued for related Japanese Patent Application No. 2012-127524 and its English translation provided by clients.
Office Action dated Mar. 24, 2015 issued for related Japanese Patent Application No. 2012-127527 and its English translation provided by clients.
Office Action dated Mar. 24, 2015 issued for related Japanese Patent Application No. 2012-127528 and its English translation provided by clients.
Office Action dated Mar. 24, 2015 issued for Japanese Patent Application No. 2013118142 and its English translation provided by clients.

* cited by examiner

TESTER HARDWARE

CROSS-REFERENCE TO RELATED APPLICATION

This application claims priority from Japanese Patent Application No. 2012-127525, filed on Jun. 4, 2012, the disclosure of which is hereby incorporated by reference in its entirety.

BACKGROUND OF THE INVENTION

1. Field of the Invention

The present invention relates to a test apparatus.

2. Description of the Related Art

In recent years, various kinds of semiconductor devices are known which are employed in various kinds of electronic devices. Examples of such semiconductor devices include: (i) memory devices such as DRAM (Dynamic Random Access Memory), flash memory, and the like; (ii) processors such as a CPU (Central Processing Unit), an MPU (Micro-Processing Unit), a micro-controller, and the like; and (iii) multifunctional devices such as a digital/analog mixed device, SoC (System On Chip), and the like. In order to test such semiconductor devices, a semiconductor test apparatus (which will also be referred to simply as "test apparatus") is employed.

The test items for such semiconductor devices can be broadly classified into (i) functional verification tests (which will also be referred to simply as the "functional tests") and (ii) DC (Direct Current) tests. With a functional verification test, judgment is made whether or not a DUT (device under test) operates normally according to its design. Examples of such a functional verification test include identification of defect positions, and acquisition of evaluation values which indicate the performance of the DUT. Examples of such a DC test include DUT leak current measurement, operation current (power supply current) measurement, breakdown voltage measurement, and the like.

The functional verification test and the DC test have various kinds of specific content for each of the various kinds of semiconductor devices. For example, in the memory functional verification test, first, a predetermined test pattern is written to the memory. Subsequently, the data thus written to the DUT is read out from the memory, and the data thus read out is compared with an expected value so as to generate pass/fail data which represents the comparison result. Although RAM and flash memory are both memory devices, different test patterns are written to the RAM and the flash memory. Furthermore, there is a difference in the writing/readout data units and the writing/readout sequence between the RAM test and the flash memory test.

In a D/A converter functional verification test, a digital signal is supplied to the input terminal of the D/A converter while sweeping the digital signal value in a predetermined range. With such an arrangement, an analog voltage is output from the D/A converter according to the respective digital values, and the analog voltage values thus output are measured. As a result, the offset voltage or the gain is measured.

On the other hand, in an A/D converter functional verification test, an analog voltage is supplied to the input terminal of the A/D converter while sweeping the analog voltage in a predetermined range. With such an arrangement, digital values are output from the A/D converter according to the respective analog voltage values, and the digital values thus output are measured. As a result, the INL (Integral Nonlinearity) or DNL (Differential Nonlinearity) is measured.

Micro-controllers, digital/analog mixed devices, SoC, and the like, each include various kinds of built-in components such as RAM, flash memory, a D/A converter, and an A/D converter. Thus, there is a need to perform respective functional verification tests for the built-in components.

Furthermore, in many cases, a boundary scan test is executed for such a semiconductor device.

In the present specification, the test item, test pattern format, test sequence, test condition, and the like, are included in the concept that will be referred to as the "test algorithm".

With conventional techniques, there are commercially available test apparatuses each designed as a dedicated test apparatus or an optimized test apparatus for each kind of such a semiconductor device, or for each test item. Thus, the user, i.e., the designer or the manufacturer of such a semiconductor device must purchase a test apparatus configured to support a particular kind of DUT and particular test items. Furthermore, in order to execute a test item which is not supported as a standard test item by a given test apparatus, the user must purchase an additional hardware component required for the test item, and must install the additional hardware component on the test apparatus.

In addition, the test apparatus cannot operate on its own. That is to say, there is a need to install a test program on the test apparatus so as to control the test apparatus. With conventional techniques, in order to execute the user's desired test, the user must develop a test program for controlling the test apparatus using a software development support tool, which is a burden on the user.

In particular, in many cases, the format is modified when the generation changes. In some cases, the test algorithm must be changed every time the standard is changed. In other words, the user must personally modify an enormous amount of test programming every time the standard is changed.

Furthermore, conventional test apparatuses are designed mainly for the purpose of testing during mass production. Thus, such conventional test apparatuses have a problem of a large size and a problem of an extremely high cost. This prevents such a test apparatus from effectively being applied to the design phase and the development phase before the mass production phase. Conventionally, in order to test a semiconductor device in the development phase, the user must separately prepare a power supply apparatus, an arbitrary waveform generator, an oscilloscope, a digitizer, and the like, and must combine these components so as to construct a test system of the user's own before the user measures the desired characteristics. For example, let us consider a case in which the user desires to test only a leak current of a processor. Conventional processor test apparatuses each have a function for measuring the leak current. However, it is unrealistic to purchase and employ such a large-size and high-cost test apparatus only for the leak current measurement. Thus, conventionally, the user must construct a measurement system using a power supply apparatus configured to generate a power supply voltage for a processor, an ammeter configured to measure a leak current, and a controller configured to control the processor to be set to a desired state (vector).

On the other hand, in a case in which the user desires to evaluate an A/D converter, the user must construct a measurement system using a power supply configured to generate a power supply voltage for the A/D converter, and an arbitrary waveform generator configured to control the input voltage to be input to the A/D converter.

Such a test system thus constructed for particular purposes has a problem of poor versatility. Furthermore, such a test system leads to a problem of complicated control operations and a problem of complicated data processing.

It should be noted that the problems described above have been uniquely studied by the present inventors, and are by no means within the scope of common and general knowledge of those skilled in this art.

SUMMARY OF THE INVENTION

The present invention has been made in order to solve such problems. Accordingly, it is an exemplary purpose of an embodiment of the present invention to provide a test apparatus which is capable of solving at least one of the aforementioned problems, and more specifically to provide a test apparatus which is capable of appropriately testing various kinds of devices under test in a simple manner.

An embodiment of the present invention relates to a tester hardware configured to supply a digital signal to a device under test and to receive a signal from the device under test according to a control signal from an information technology equipment. The tester hardware comprises a control module, a device power supply, an internal power supply, multiple channels of tester pins, multiple drivers, multiple voltage comparators, first nonvolatile memory, and at least one first programmable device. The control module is configured to transmit/receive data between the control module and the information technology equipment, and to control each block of the tester hardware. The device power supply is configured to generate a power supply voltage for the device under test. The internal power supply is configured to generate a power supply voltage to be used in the tester hardware.

The multiple drivers are respectively provided for the channels, and are each arranged such that a pattern signal is received via its input terminal, and a driver enable signal is received via its driver enable terminal, and are each configured such that, when the driver enable signal is asserted, the driver outputs a test pattern having a voltage level that corresponds to the pattern signal, and when the driver enable signal is negated, the output of the driver is set to a high-impedance state. The multiple voltage comparators are respectively provided for the channels, and are each configured to compare a voltage level of a digital signal input via a corresponding tester pin from the device under test with a predetermined high threshold voltage and a predetermined low threshold voltage. The first memory is configured as rewritable memory, and configured to store first configuration data.

The aforementioned at least one first programmable device is arranged such that it is connected to respective input terminals of the multiple drivers, respective enable terminals of the multiple drivers, and respective output terminals of the multiple voltage comparators, and is configured such that its internal circuit information is defined according to the first configuration data stored in the first nonvolatile memory.

In a state in which the first configuration data is loaded, internal components of the aforementioned at least one programmable device are configured so as to function as: (1) multiple latch circuits respectively provided for the voltage comparators, and each configured to latch an output signal of the corresponding voltage comparator at a timing of a strobe signal; (2) multiple digital comparators respectively provided for the latch circuits, and each configured to compare an output of the corresponding latch circuit with a corresponding expected value, and to generate a pass/fail signal which indicates whether or not the output agrees with the expected value; (3) a pattern generator configured to generate pattern data which defines the pattern signals to be respectively output to the multiple drivers, the driver enable signals to be respectively output to the multiple drivers, and the expected value data to be respectively output to the multiple digital comparators; (4) a timing generator configured to generate a timing signal and the strobe signal; and (5) a format controller configured to receive the pattern data and the timing signal, and to generate the pattern signal having a level that corresponds to the pattern data, and having an edge timing that corresponds to the timing signal.

With such an embodiment, by preparing the first configuration data so as to provide suitable respective functions as the pattern generator, the timing generator, and the format controller, according to the kind of device under test and the test items, and by writing the first configuration data to the first nonvolatile memory, such an arrangement is capable of appropriately testing various kinds of devices under test.

Also, by integrally configuring multiple latch circuits, multiple digital comparators, a pattern generator, a timing controller, and a format controller by means of a single programmable device, such an arrangement provides a small-size tester hardware.

Also, the multiple latch circuits, the multiple digital comparators, the pattern generator, the timing generator, and the format controller may be configured in the form of multiple components by means of multiple programmable devices. Such an arrangement allows the user to employ programmable devices each having a small number of gates. Such an arrangement provides such a tester hardware with a low cost.

Also, the pattern generator may be configured to be capable of switching the pattern data generating method according to the first configuration data written to the first nonvolatile memory.

With such an embodiment, by selecting the configuration data according to the kind of device before a function verification test is performed for a device under test such as memory, a processor, or the like, such an arrangement is capable of appropriately testing various kinds of devices.

Also, the pattern generator may be configured to function as at least one of an SQPG (Sequential Pattern Generator), an ALPG (Algorithmic Pattern Generator), and an SCPG (Scan Pattern Generator), configured to operate according to the first configuration data.

With such an embodiment, by writing the configuration data that corresponds to the ALPG to the nonvolatile memory before a memory function verification test is performed, such an arrangement is capable of automatically generating a very long test pattern by means of calculation. Also, in a case of performing a function verification test for a processor or the like, the configuration data that corresponds to the SQPG is written to the nonvolatile memory. Such an arrangement is capable of reading out a test pattern defined beforehand according to the configuration of the processor or the like from the memory, and of supplying the test pattern thus read out to the device under test. Also, in a case in which a boundary scan test is to be performed, by writing the configuration data that corresponds to the SCPG to the nonvolatile memory, such an arrangement is capable of performing a test without involving the internal logic of the device.

Also, the tester hardware according to an embodiment may further comprise volatile memory. Also, in a state in which the first configuration data is loaded, an internal component of the aforementioned at least one first programmable device may be configured so as to function as a fail memory controller configured to instruct the volatile memory to store the pass/fail signals output from the multiple digital comparators.

By configuring a fail memory controller in at least one first programmable device, such an arrangement allows the first programmable device to perform all of the series of digital processing comprising: supplying a digital signal to a device under test; and judging the quality of a digital signal that is read out. As a result, such an arrangement allows the tester hardware to perform the control operation in a simpler manner according to the test program.

Also, the tester hardware according to an embodiment may further comprise: second rewritable nonvolatile memory configured to store second configuration data; multiple first D/A converters configured to generate respective high power supply voltages for the multiple drivers; multiple second D/A converters configured to generate respective low power supply voltages for the multiple drivers; and a second programmable device connected to the second nonvolatile memory and respective input terminals of the first and second D/A converters, and configured such that its internal circuit information is defined according to the second configuration data stored in the second nonvolatile memory. Also, in a state in which the second configuration data is loaded, an internal component of the second programmable device may be configured so as to function as a pin controller configured to output, to an input terminal of each first D/A converter, a control value which indicates a high-level voltage of the test pattern, and to output, to an input terminal of each second D/A converter, a control value which indicates a low-level voltage of the test pattern.

With such an embodiment, the first programmable device performs a series of digital processing comprising supplying a digital signal to a device under test and judging the quality of the digital signal that is read out. Furthermore, the second programmable device performs the other analog device control operation. As a result, the design or debugging of the tester hardware can be performed separately for the control operation of the digital block and the control operation of the analog block, thereby providing improved design efficiency.

Also, the tester hardware according to an embodiment may further comprise: multiple third D/A converters configured to generate respective high threshold voltages for the multiple voltage comparators; and multiple fourth D/A converters configured to generate respective low threshold voltages for the multiple voltage comparators. Also, the second programmable device may be connected to the third and fourth D/A converters. Also, the pin controller may be configured to output, to input terminals of the third D/A converters, a control value which indicates the high threshold voltage, and to output, to input terminals of the second D/A converters, a control value which indicates the low level voltage of the test pattern.

Also, the tester hardware according to an embodiment may further comprise: second rewritable nonvolatile memory configured to store second configuration data; and a second programmable device connected to the second nonvolatile memory and the device power supply, and configured such that its internal circuit information is defined according to the second configuration data stored in the second nonvolatile memory. Also, in a state in which the second configuration data is loaded, an internal component of the second programmable device may be configured so as to function as a device power supply controller configured to control the device power supply.

With such an embodiment, the first programmable device performs a series of digital processing comprising supplying a digital signal to a device under test and judging the quality of the digital signal that is read out. Furthermore, the second programmable device performs the other analog device control operation. As a result, the design or debugging of the tester hardware can be performed separately for the control operation of the digital block and the control operation of the analog block, thereby providing improved design efficiency.

Also, the tester hardware according to an embodiment may further comprise: second rewritable nonvolatile memory configured to store second configuration data; and a parametric measurement unit including a voltage source, a current source, an ammeter, and a voltmeter. Also, a relay switch group may be configured to assign the parametric measurement unit to a desired tester pin. Also, in a state in which the second configuration data is loaded, an internal component of the second programmable device may be configured so as to function as a DC controller configured to control the parametric measurement unit.

Also, the tester hardware according to an embodiment may further comprise: second rewritable nonvolatile memory configured to store second configuration data; an arbitrary waveform generator configured to generate an analog arbitrary waveform signal; and a second programmable device connected to the second nonvolatile memory and the arbitrary waveform generator, and configured such that its internal circuit information is defined according to the second configuration data stored in the second nonvolatile memory. Also, a relay switch group may be configured to assign the arbitrary waveform generator to a desired tester pin. Also, in a state in which the second configuration data is loaded, an internal component of the second programmable device may be configured so as to function as a waveform generator controller configured to control the arbitrary waveform generator.

With such an embodiment, the first programmable device performs a series of digital processing comprising supplying a digital signal to a device under test and judging the quality of the digital signal that is read out. Furthermore, the second programmable device performs the other analog device control operation. As a result, the design or debugging of the tester hardware can be performed separately for the control operation of the digital block and the control operation of the analog block, thereby providing improved design efficiency.

Also, the tester hardware according to an embodiment may further comprise: second rewritable nonvolatile memory configured to store second configuration data; a digitizer configured to convert an analog voltage into a digital signal; and a second programmable device connected to the second nonvolatile memory and the digitizer, and configured such that its internal circuit information is defined according to the second configuration data stored in the second nonvolatile memory. Also, a relay switch group may be configured to assign the digitizer to a desired tester pin. Also, in a state in which the second configuration data is loaded, an internal component of the second programmable device may be configured so as to function as a digitizer controller configured to control the digitizer.

With such an embodiment, the first programmable device performs a series of digital processing comprising supplying a digital signal to a device under test and judging the quality of the digital signal that is read out. Furthermore, the second programmable device performs the other analog device control operation. As a result, the design or debugging of the tester hardware can be performed separately for the control operation of the digital block and the control operation of the analog block, thereby providing improved design efficiency.

Also, the control module may be configured to instruct the pattern generator to start to generate the pattern data according to a control signal from the information technology equipment, and to notify the information technology equipment of the completion of generation of the pattern data when the control module detects the completion of the generation of the pattern data. Also, when the information technology equipment receives a notice of completion of generation of the pattern data, the information technology equipment may be configured to read out a pass/fail signal.

Also, the device power supply, the internal power supply, the multiple channels of tester pins, the multiple drivers, the multiple voltage comparators, the first nonvolatile memory, and the first programmable device may form a single function module. Also, the tester hardware may be configured such that the number of channels is changeable in units of the aforementioned function modules.

Such an arrangement allows a tester hardware having a variable number of channels to be designed in a simple manner.

Also, a bus may be configured on each function module via the aforementioned at least one first programmable device. Also, the multiple function modules may be configured to allow the respective buses to be connected in series.

Such an arrangement allows data to be transmitted and received between the respective first programmable devices of the multiple function modules and the control module via a single bus.

Also, the control module may comprise: a system controller; an expansion port having an input terminal via which a signal is to be received from the exterior and an output terminal via which a signal is to be output to the exterior; and a selector configured to select a signal from among a signal input from the expansion port and a signal received from the system controller. Also, the multiple tester hardware may be each configured so as to allow them to be connected in series.

Another embodiment of the present invention relates to a test system configured to test a device under test. The test system comprises a tester hardware and an information technology equipment.

The tester hardware comprises rewritable nonvolatile memory, and is configured to be capable of changing at least a part of its functions according to configuration data stored in the nonvolatile memory, to supply a power supply voltage to at least the aforementioned device under test, to transmit a signal to the device under test, and to receive a signal from the device under test. The tester hardware is configured according to any one of the aforementioned embodiments.

The information technology equipment comprises: (i) a data acquisition unit configured such that, when the test system is set up, the data acquisition unit acquires the configuration data suitable for test content specified by the user, in response to a user's input, from among multiple configuration data prepared for supplying various kinds of functions to the test system; (ii) a hardware access unit configured to write the configuration data to the nonvolatile memory of the tester hardware; and (iii) a test control unit configured to execute a test program when the device under test is tested, to control the tester hardware according to the test program, and to process data acquired by the tester hardware.

With such an embodiment, the tester hardware does not have a dedicated configuration limited to a particular device or particular test item. Rather, the test hardware is designed to have high versatility which supports various kinds of devices under test and various kinds of test items. With such an arrangement, various kinds of configuration data optimized for various kinds of devices to be tested and optimized for various kinds of test content are prepared by the service provider or a third party.

By selecting the optimum configuration data for the device under test to be tested, and by writing the configuration data thus selected to the nonvolatile memory included in the tester hardware, such an arrangement allows the user to appropriately test the device under test. With such an embodiment, there is no need to prepare dedicated test apparatuses (hardware) for each kind of device under test or each test item, thereby providing a reduced cost for the user.

If a new test that has not previously existed is required after a device is newly developed, the configuration data and the program module configured to support the new test can be provided by the service provider or by a third party. Thus, for devices that are within the range of the processing capacity of the tester hardware, such an arrangement allows the user to test devices from currently developed devices to devices that will be developed in the future.

With conventional techniques, before a semiconductor device in the development phase is tested, there is a need to prepare a power supply apparatus, an arbitrary waveform generator, and an oscilloscope or a digitizer, each configured as separate components, and to combine the separate components thus prepared so as to measure desired characteristics of the device. In contrast, with the test system, by preparing only the information technology equipment and the tester hardware, such an arrangement allows the user to appropriately test various kinds of semiconductor devices in a simple manner.

If the tester hardware is used in the development phase, the tester hardware can be designed assuming that the number of devices to be tested at the same time is smaller, i.e., designed with a reduced number of channels. Furthermore, the tester hardware can be designed assuming that it will operate in cooperation with the information technology equipment. Moreover, the tester hardware can be designed with a part of the functions omitted as necessary. This allows the tester hardware to be configured with a low cost and with a very compact size, as compared with conventional test apparatuses for the mass production phase. Specifically, this allows the tester hardware to be configured with a desktop size or a portable size.

From the viewpoint of the user, such an arrangement allows each researcher or each developer or otherwise each researcher/developer group to personally possesses the tester hardware. From the viewpoint of the service provider, such an arrangement allows the tester hardware to become popular, thereby expanding its business.

Conventional test apparatuses have a large size, which in practice does not allow the user to move such a large-size test apparatus. Instead, the user must move the device under test to the conventional test apparatus. In contrast, with the tester hardware configured to have a reduced size, such an arrangement allows the user to move the tester hardware to the location of the device under test. Such an arrangement dramatically extends the conditions in which the test apparatus can be used, as compared with conventional techniques.

Also, before the user uses the configuration data, a service provider that has a relation to the test system may issue a first license key including identification information with respect to the configuration data to be licensed, and identification information with respect to the information technology equipment to be licensed to use the configuration data. Also, the hardware access unit may be configured to be capable of acquiring information with respect to the configuration data stored in the nonvolatile memory of a currently connected tester hardware. Also, the information technology equipment may further comprise: a license key holding unit configured to hold the first license key; and an authentication unit configured to judge whether or not the identification information with respect to the information technology equipment included in the first license key agrees with the identification information with respect to the information technology equipment mounting the license key holding unit when the license key holding unit holds the first license key including the identification information with respect to the configuration data. Also, when the authentication unit succeeds in authentication with respect to the first license key, the first configuration data may be loaded into the first programmable device.

That is to say, instead of licensing a particular tester hardware with respect to the configuration data, the service provider may license a particular information technology equipment with respect to the configuration data.

Examples of usage cases include a case in which the user possesses multiple tester hardware, and desires to write the same configuration data to each tester hardware, and to control the tester hardware by means of a single common processing apparatus. With such an arrangement, from the user viewpoint, there is no need to apply for a license for each tester hardware. That is to say, such an arrangement requires the user to apply for only a single license for a single information technology equipment in order to use the configuration data. Such an arrangement provides a benefit to the user from the viewpoint of costs. In particular, in a case in which such a tester hardware is lent or sold without compensation or otherwise at a very low cost, such a benefit becomes marked.

In some cases, a first tester hardware is placed at a first position, a second tester hardware is placed at a second position, and the user desires not to move the first tester hardware and the second tester hardware. In this case, by bringing the licensed information technology equipment to the first position and the second position, such an arrangement allows the first and second tester hardware to be controlled by the same information technology equipment. Furthermore, such an arrangement allows such a common information technology equipment to accumulate the data that relates to the test results.

Furthermore, in the test operation of the tester hardware, such an arrangement only requires the user to connect the tester hardware to the licensed information technology equipment. That is to say, there is not necessarily a need to write the configuration data to the tester hardware from the licensed information technology equipment. Thus, such an arrangement allows the user to manage the information technology equipment and the tester hardware with improved flexibility.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

[Overall Configuration of Test System]

Figure 1:
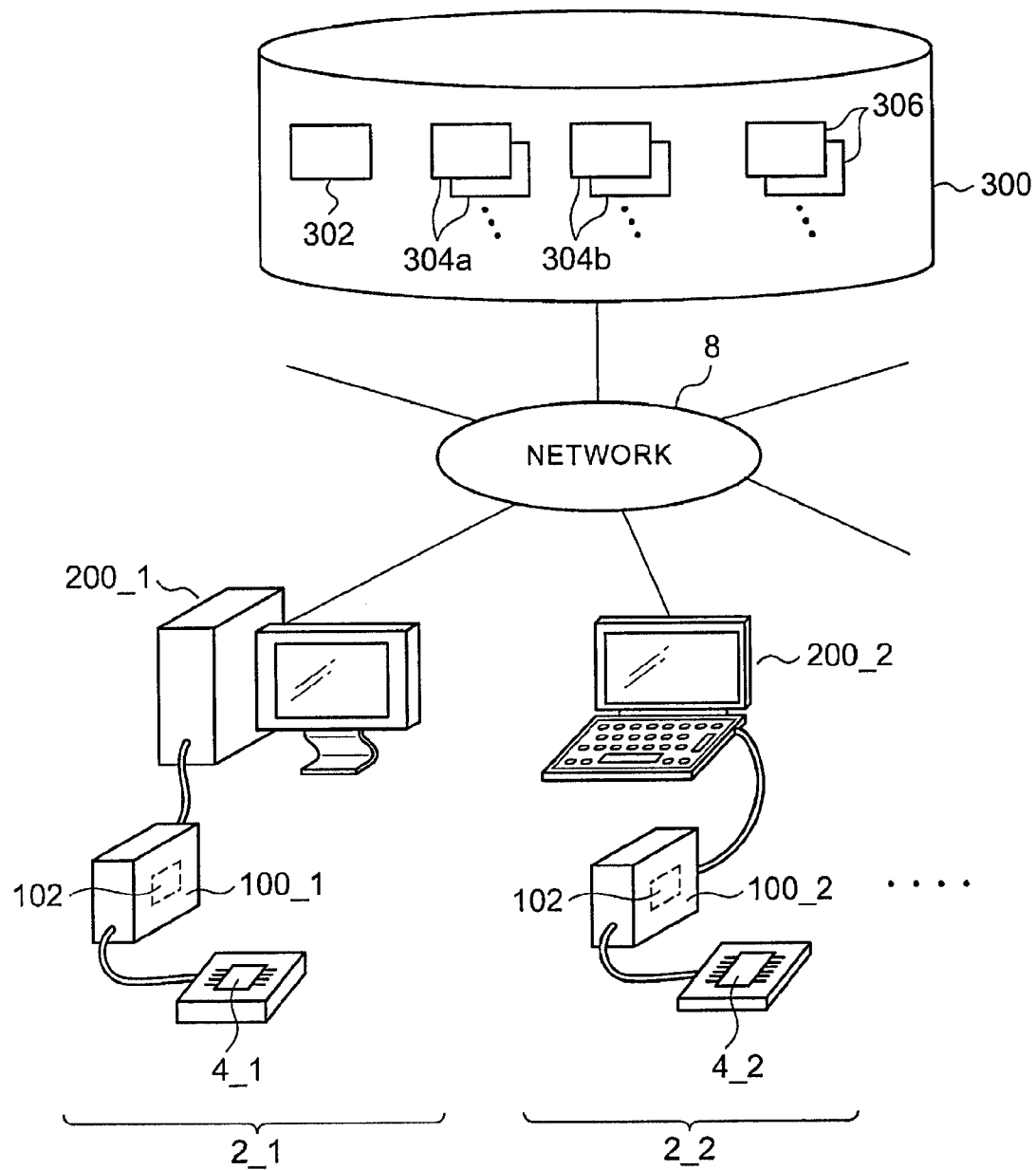
FIG. 1 is a block diagram showing a configuration of a test system according to an embodiment.

FIG. 1 is a block diagram showing a configuration of a test system 2 according to an embodiment. In the present specification, the service to be provided to the test system 2 will also be refereed to as a "cloud testing service". The cloud testing service is provided by the service provider PRV. On the other hand, the user who is to test a DUT 4 using the test system 2 will be referred to as "user USR".

The test system 2 includes a tester hardware 100, an information technology equipment 200, and a server 300.

The server 300 is managed and operated by the service provider PRV, and is connected to a network 8 such as the Internet. The service provider PRV establishes a website for the cloud testing service. Such an arrangement allows the user USR to access the website so as to apply for registration to use the test system 2 and the like.

The server 300 stores a control program 302, a program module 304, configuration data 306, and the like, to be used by the information technology equipment 200 and the tester hardware 100. Detailed description will be made later regarding the control program 302, the program module 304, and the configuration data 306. Such an arrangement allows the user USR to access the server 300 so as to acquire (download) such software components 302, 304, and 306. Furthermore, such an arrangement allows the user USR to submit an application for a license key for the downloaded software component 302 or the like to the service provider PRV via the aforementioned website.

The test system 2 is configured for each information technology equipment 200. Thus, a tester hardware 100_1, an information technology equipment 200_1, and the server 300 form a single test system 2_1. Furthermore, a tester hardware 100_2, an information technology equipment 200_2, and the server 300 form a single test system 2_2. Such an arrangement allows each of the test systems 2_i (i=1, 2, 3, . . . ) to operate independently.

The tester hardware 100 includes rewritable nonvolatile memory (PROM: Programmable ROM) 102, and is configured to allow at least a part of its functions to be changed according to the configuration data 306 stored in the nonvolatile memory 102. In the test operation, the tester hardware 100 is configured to supply the power supply voltage to at least the DUT 4, to transmit a signal to the DUT 4, and to receive a signal from the DUT 4.

The tester hardware 100 is designed by the service provider PRV, and is provided to the user. The configuration of the tester hardware 100 is not restricted to a dedicated configuration for a particular kind of semiconductor device or particular test content. Rather, the tester hardware 100 is designed to have high versatility, thereby supporting various kinds of test content.

[Information Technology Equipment]

Examples of the information technology equipment 200_i includes a general-purpose desktop PC (Personal Computer), a laptop PC, a tablet PC, and a workstation, and so forth. The minimum functions required for each information technology equipment 200_i include: (a) a function for connecting to the network 8 so as to access the server 300; (b) a function for executing a test program provided by the service provider; and (c) a function for transmitting/receiving data to/from the tester hardware 100. In many cases, typical commercially available information technology equipments each have such functions as their standard functions. Such an information technology equipment is commercially available at a low cost.

Figure 2:
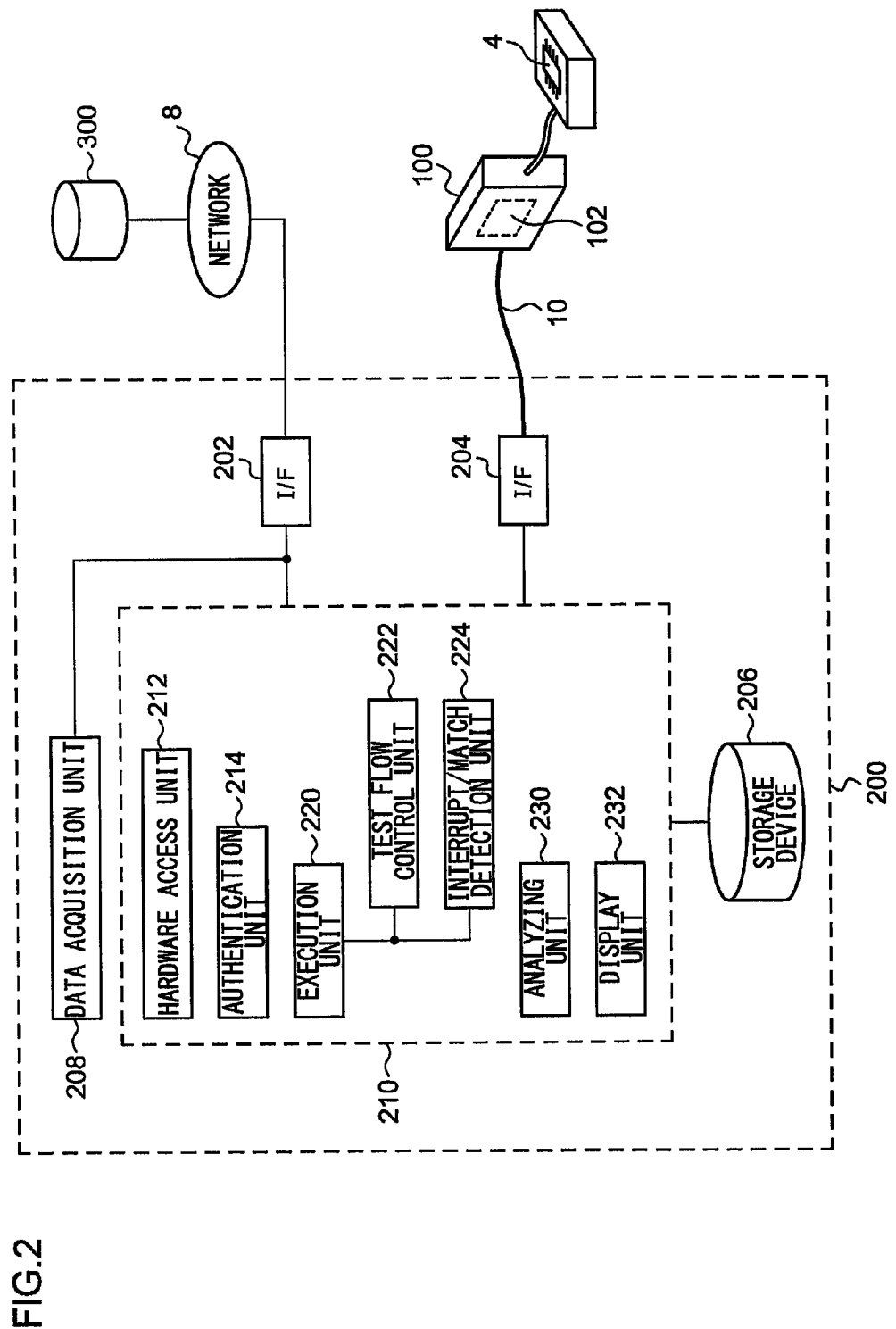
FIG. 2 is a functional block diagram showing an information technology equipment.

FIG. 2 is a functional block diagram showing the information technology equipment 200. The information technology equipment 200 includes a first interface unit 202, a second interface unit 204, a storage device 206, a data acquisition unit 208, and a test control unit 210. It should be noted that each component represented as a functional block configured to perform various kinds of processing may be realized by means of hardware devices such a CPU, memory, and other LSIs, or otherwise may be realized by means of software components such as a program or the like loaded into memory. Thus, such functional blocks can be realized by hardware components alone, software components alone, or various combinations thereof, which can be readily conceived by those skilled in this art, and the present invention is by no means intended to be restricted to any one of the aforementioned arrangements.

The first interface unit 202 is an interface configured to transmit/receive data to/from the network 8. Specific examples of the first interface unit 202 include an Ethernet (trademark) adapter, wireless LAN adapter, and the like.

The second interface unit 204 is connected to the tester hardware 100 via a bus 10, and is configured as an interface configured to transmit/receive data to/from the tester hardware 100. For example, the information technology equipment 200 and the tester hardware 100 are connected to each other via a USB (Universal Serial Bus) interface.

The data acquisition unit 208 is configured to access the server 300 via the first interface unit 202, and to acquire the control program 302, the program module 304, and the configuration data 306. It should be noted that the device from which the data acquisition unit 208 is to receive such data is not restricted to the server 300. Also, the data acquisition unit 208 may acquire such data from a different device after the different device receives such data from the server 300. That is to say, the data acquisition unit 208 may acquire such data secondarily or indirectly from the server 300.

The control program 302, the program module 304, and the configuration data 306 acquired from the outside are stored in a storage device 206.

The test control unit 210 is configured to set up the tester hardware 100, and to control the tester hardware 100. Furthermore, the test control unit 210 is configured to process and analyze the data obtained as a result of the test of the DUT 4. The CPU included in the information technology equipment 200 is configured to execute the control program 302 provided by the service provider RPV, so as to provide the functions of the test control unit 210.

The test control unit 210 includes a hardware access unit 212, an authentication unit 214, an execution unit 220, a test flow control unit 222, an interrupt/match detection unit 224, an analyzing unit 230, and a display unit 232.

The hardware access unit 212 is configured to write the configuration data 306 to the nonvolatile memory 102 included within the tester hardware 100. Furthermore, the hardware access unit 212 is configured to acquire the information with respect to the configuration data 306 written to the nonvolatile memory 102, the version information with respect to the tester hardware 100, and the like.

The authentication unit 214 is configured to judge whether or not the user has been licensed beforehand to use the control program 302, the program module 304, and the configuration data 306.

The execution unit 220 is configured to execute the test program, and to control the test sequence of the tester hardware 100. The test sequence represents a series of processing operations including: initialization of the tester hardware 100; initialization of the DUT 4; supply of a test pattern to the DUT 4; readout of a signal from the DUT 4; comparison between the signal thus read out and an expected value; and the like. In other words, the test program is configured to allow the tester hardware 100 and the information technology equipment 200 to execute the test sequence for the test content suitable for the DUT 4. The test flow control unit 222 is configured to control the order of the test items specified in the test program to be executed by the execution unit 220.

A control command for the tester hardware 100 is transmitted to the tester hardware 100 via the second interface unit 204 and the bus 10. The tester hardware 100 is configured to operate according to a control command received from the information technology equipment 200.

When the tester hardware 100 detects an abnormality in the tester hardware 100 such as abnormal temperature, the tester hardware 100 is configured to transmit, to the test control unit 210, an interrupt, signal which indicates that an abnormality has occurred. In some cases, the test sequence for the DUT 4 includes conditional branching. In some cases, a hardware component included within the tester hardware 100 is configured to make judgment for the conditional branching. For example, in a case in which the DUT 4 is configured as memory, when the tester hardware 100 writes a test pattern having a given data length to the memory, the tester hardware 100 judges whether or not the tester hardware 100 completes the writing of the last data of the test pattern. Also, the tester hardware 100 is configured to judge whether flash memory is in the busy state or in the ready state. Such conditional judgment made by the tester hardware 100 will be referred to as "match detection". The tester hardware 100 is configured to transmit, to the test control unit 210, a flag which indicates the match detection result.

The interrupt/match detection unit 224 is configured to monitor an interrupt signal and a match detection flag. The order of the commands specified in the test program to be executed is controlled according to the monitoring result obtained by the interrupt/match detection unit 224.

The data acquired by the tester hardware 100 is transmitted to the test control unit 210 via the bus 10. The analyzing unit 230 is configured to process and analyze the data thus received. The display unit 232 is configured to provide a GUI (Graphical User Interface) required for the user to control the test program via the display, and to display, on a display, the data obtained as a result of the test.

In summary, each information technology equipment 200_i has the following functions.

(i) Each information technology equipment 200_i has a function of acquiring the configuration data 306 suitable for the desired test content from the server 300 according to the user input when the test system 2_i is set up, and of writing the configuration data 306 thus acquired to the nonvolatile memory 102 included in the tester hardware 100_i connected to the information technology equipment 200_i.

(ii) Each information technology equipment 200_i has a function of executing the test program when the DUT 4 is tested, of controlling the tester hardware 100_i according to the test program, and of processing data acquired by the tester hardware 100_i.

Figure 3:
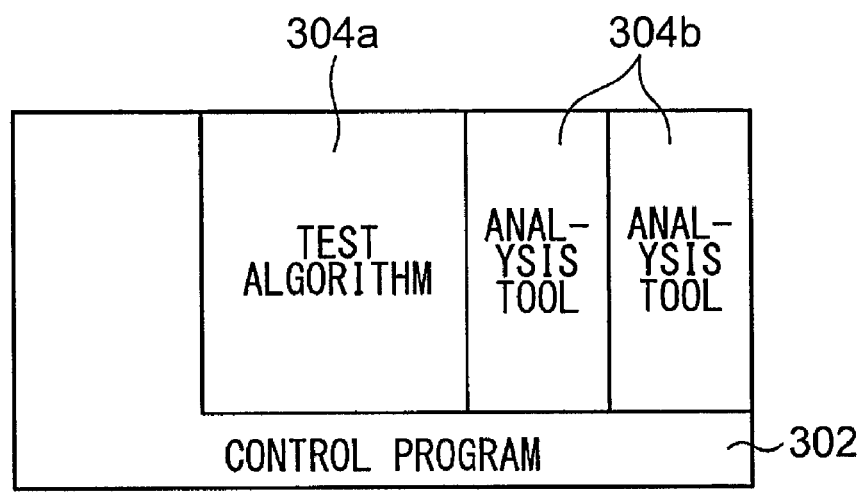
FIG. 3 is a diagram showing a configuration of a test program executed by the information technology equipment.

FIG. 3 is a diagram showing a configuration of the test program executed by the information technology equipment 200. The test program 240 is composed of the control program 302 and the program module 304. The control program 302 is the foundation of the test program 240, and is commonly used regardless of the kind of device under test and the test content. The control program 302 provides the functions of the hardware access unit 212, the functions of the authentication unit 214, the functions of the execution unit 220, the functions of the test flow control unit 222, and the functions of the interrupt/match detection unit 224.

On the other hand, the program module 304 can be selectively embedded in the control program 302. The program module 304 can be roughly classified into two modules, i.e., a test algorithm module 304a and an analysis tool module 304b.

The test algorithm module 304a is a program configured to define a test algorithm, and specifically the test item, test content, test sequence, test pattern, and the like. Examples of the test algorithm module 304a are listed below according to categories (functions).

(1) DRAM
Function verification program
DC test program (including power supply test program, output voltage test program, output current test program, and the like)
(2) Flash Memory
Function verification program
DC test program
(3) Micro-Controller
Function verification program
DC test program
Embedded flash memory evaluation program
(4) A/D Converter and D/A Converter
Contact verification program
Linearity (INL, DNL) verification program
Output voltage offset verification program
Output voltage gain verification program The analysis tool module 304b is a program configured to define the evaluation algorithm, and specifically to define a method for processing, analyzing, and visualizing the data obtained as a result of the test performed by the tester hardware 100. Examples of the analysis tool module 304b will be listed below.
Shmoo plot (two-dimensional characteristics evaluation) tool
Oscilloscope tool
logic analyzer tool
analog waveform observation tool
[Server]
The server 300 stores multiple test algorithm modules 304a provided by the service provider PRV. Such an arrangement allows the user to acquire the required analysis tool module 304b according to the kind of DUT 4 or the test content, and to embed the analysis tool module 304b thus acquired in the test program 240. Thus, with such a test program 240, such an arrangement is capable of selecting and changing the test content to be executed and the kind of data to be acquired by the test system 2 according to the analysis tool module 304 thus embedded.

Furthermore, the server 300 stores multiple analysis tool modules 304b provided by the service provider PRV. Such an arrangement allows the user to acquire the required analysis tool module 304b according to the kind of DUT 4, the test content, and the evaluation method, and to embed the analysis tool module 304b thus acquired in the test program 240. With such a test program 240, such an arrangement is capable of selecting and changing the data processing method and the data analysis method for the data acquired by the test system 2, according to the embedded analysis tool module 304b.

Figure 4:
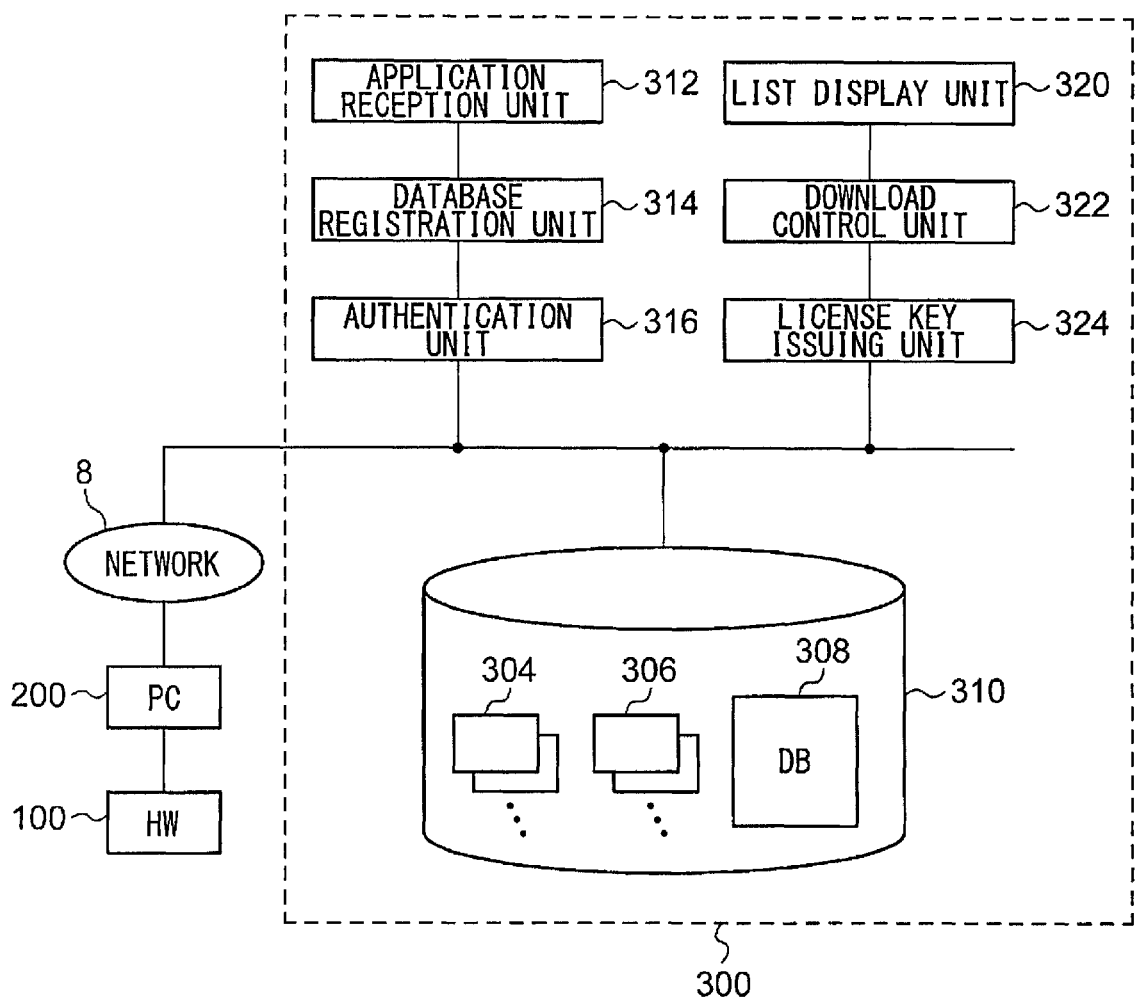
FIG. 4 is a functional block diagram showing a configuration of a server.

FIG. 4 is a functional block diagram showing the configuration of the server 300.

The server 300 includes a storage unit 310, an application reception unit 312, a database registration unit 314, a list display unit 320, a download control unit 322, and a license key issuing unit 324.

The storage unit 310 is configured to store the multiple program modules 304, the multiple configuration data 306, a database 308, and other programs and data.

The application reception unit 312 is configured to receive an application to use a cloud testing service from the user USR. After an examination performed by the service provider PRV, the database registration unit 314 registers, in the database 308, the information with respect to the user USR, i.e., the user ID, login password, and the like. Furthermore, the database registration unit 314 registers, in the database 308, the identification information for the information technology equipment 200 specified by the user USR.

The authentication unit 316 is configured to perform the login authentication of the user when the user accesses the server 300. Specifically, the authentication unit 316 is configured to prompt the user to input the user ID and the password, and to judge whether or not the user ID and the password agree with those registered in the database 308. After the user's successful login authentication, the user is able to download software and data, to apply for a license key, and the like.

The download control unit 322 is configured to display the list of the multiple program modules 304 and the multiple configuration data 306 stored in the storage unit 310 as items that can be downloaded by the user.

The download control unit 322 is configured to provide the program module 304 or the configuration data 306 to the information technology equipment 200 in response to a request from the user to download the program module 304 or the configuration data 306.

The license key issuing unit 324 is configured to receive an application from the user USR to use the configuration data 306, and to issue a first license key KEY1 to the user USR to be licensed. Furthermore, the license key issuing unit 324 is configured to receive an application from the user USR to use the program module 304, and to issue a second license key KEY2 for the user USR to be licensed.
[Tester Hardware]

Figure 5:
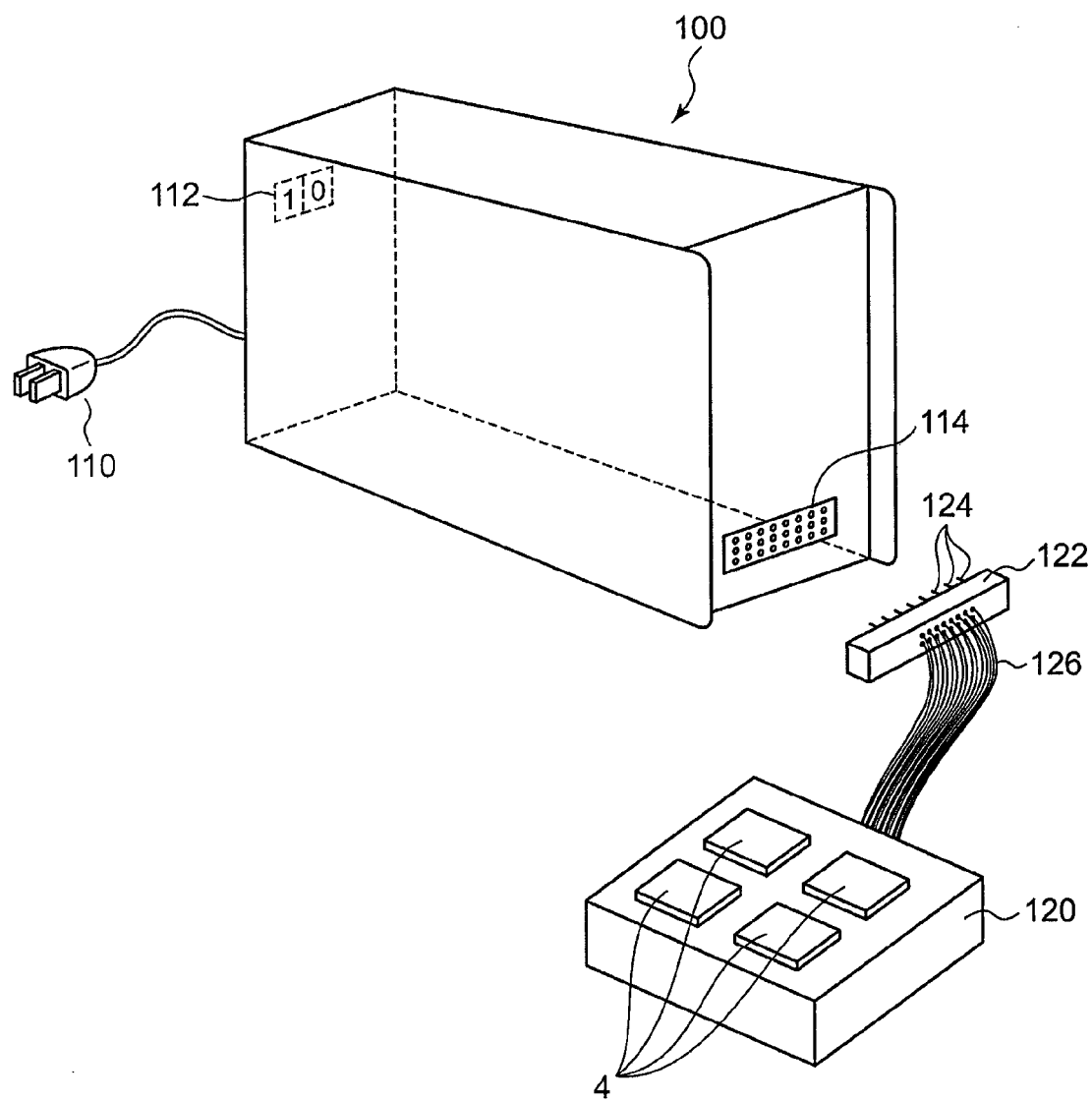
FIG. 5 is an external view of a tester hardware.

Next, description will be made regarding the configuration of the tester hardware 100. FIG. 5 is a diagram showing an external configuration of the tester hardware 100. The tester hardware 100 is configured to have a desktop-sized, portable configuration.

The tester hardware 100 is configured to receive electric power from a commercial AC power supply via an AC plug 110. The tester hardware 100 includes, on its back face, a power supply switch 112 for the tester hardware 100.

The DUT 4 is mounted on a socket 120. Multiple device pins of the DUT 4 are respectively connected to multiple pins 124 of a connector 122 via a cable 126. The tester hardware 100 includes, on its front face panel, a connector 114 which allows the connector 122 to be connected to the tester hardware 100. Various kinds of sockets 120 are prepared according to the number of pins and the pin layout of the DUT 4, or otherwise according to the number of DUTs 4 to be measured at the same time.

Figure 6:
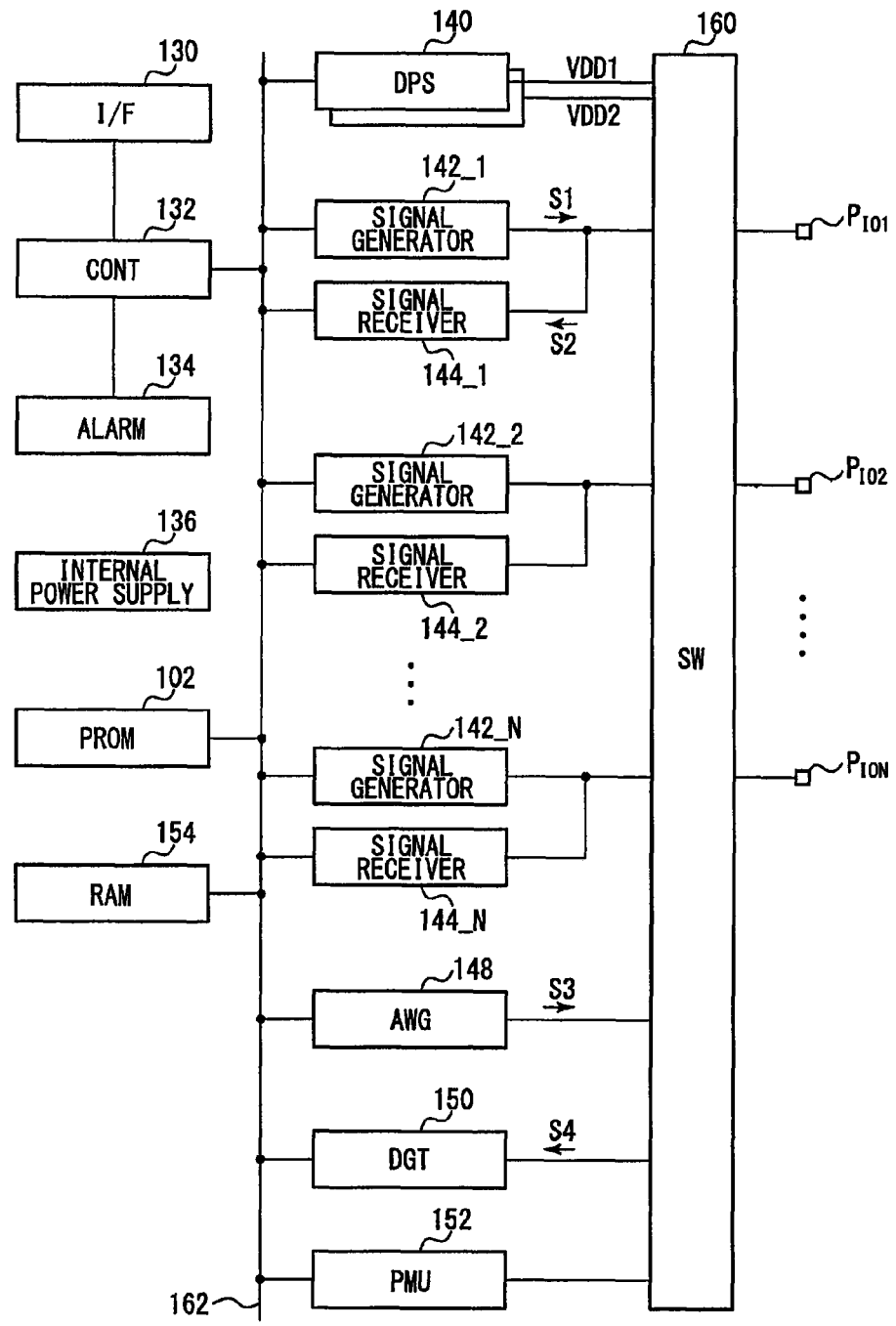
FIG. 6 is a functional block diagram showing a configuration of the tester hardware.

FIG. 6 is a functional block diagram showing a configuration of the tester hardware 100. The tester hardware 100 includes multiple channel tester pins (input/output pins) $P_{IO1}$ through $P_{ION}$, an interface unit 130, a controller 132, an abnormality detection unit 134, an internal power supply 136, a device power supply 140, a signal generator 142, a signal receiver 144, RAM 154, an arbitrary waveform generator 148, a digitizer 150, a parametric measurement unit 152, a relay switch group 160, and an internal bus 162, in addition to the nonvolatile memory 102.

The interface unit 130 is connected to the second interface unit 204 of the information technology equipment 200 via the bus 10, and is configured to transmit/receive data to/from the information technology equipment 200. In a case in which the bus 10 is configured as a USB bus, the interface unit 130 is configured as a USB controller.

The controller 132 is configured to integrally control the overall operation of the tester hardware 100. Specifically, the controller 132 is configured to control each block of the tester hardware 100 according to a control command received from the information technology equipment 200, and to transmit data, an interrupt signal, a match signal, and the like, obtained by each block of the tester hardware 100, to the information technology equipment 200.

The abnormality detection unit 134 is configured to detect a hardware abnormality that can occur in the tester hardware 100. For example, the abnormality detection unit 134 is configured to monitor the temperature of the tester hardware 100, and to generate a temperature abnormality detection signal which is asserted when the temperature exceeds a predetermined threshold value. Also, the abnormality detection unit 134 may be configured to monitor the power supply voltage in the tester hardware 100, and to detect an overvoltage abnormality, a low-voltage abnormality, and the like.

The internal power supply 136 is configured to receive an external AC voltage, and to rectify and smooth the external AC voltage thus received, thereby converting the AC voltage into a DC voltage. Subsequently, the internal power supply 136 is configured to step down the DC voltage thus converted, so as to generate a power supply voltage for each block of the tester hardware 100. The internal power supply 136 may be configured including an AC/DC conversion inverter, a switching regulator or a linear regulator configured to step down the output of the inverter, and the like.

The device power supply (DPS) 140 is configured to generate a power supply voltage VDD to be supplied to the power supply pin of the DUT 4 connected to the tester hardware 100. In some cases, the DUT 4 configured as an analog/digital mixed device or the like operates receiving multiple different power supply voltages. Thus, the device power supply 140 may be configured to generate multiple different power supply voltages. With the present embodiment, the device power supply 140 is configured to generate two channels of power supply voltages VDD1 and VDD2.

The tester pins $P_{IO1}$ through $P_{ION}$ of the multiple channels CH1 through CHN are respectively connected to the device pins of the DUT 4.

The signal generators 142_1 through 142_N are respectively provided to the channels CH. Each signal generator 142_i ($1 \le i \le N$) is configured to output a digital signal S1 to the DUT 4 via the corresponding tester pin $P_{IOi}$. In a case in which the DUT 4 is configured as memory, the digital signal S1 corresponds to a control signal for the DUT, a data signal to be written to the memory configured as the DUT, an address signal, or the like.

The signal receivers 144_1 through 144_N are respectively provided to the channels CH. Each signal receiver 144_i ($1 \le i \le N$) is configured to receive a digital signal S2 from the DUT 4 via the corresponding tester pin $P_{IOi}$. The digital signal S2 corresponds to various kinds of signals output from the DUT, or data read out from the memory configured as the DUT. The signal receiver 144 is configured to judge the level of the signal S2 thus received. Furthermore, the signal receiver 144 is configured to judge whether or not the level of the signal S2 thus received agrees with an expected value, and to generate a pass/fail signal which indicates whether the signal level agrees with the expected value (pass) or does not agree with the expected value (fail). In addition, the signal receiver 144 is configured to judge whether or not the timing of the signal S2 thus received is normal, and to generate a pass/fail signal which indicates the judgment result.

The arbitrary waveform generator 148 can be assigned to a desired channel selected from among the multiple channels CH1 through CHN, and is configured to generate an analog arbitrary waveform signal S3, and to output the signal thus generated via the tester pin $P_{IO}$ thus assigned. The digitizer 150 can be assigned to a desired channel selected from among the multiple channels CH1 through CHN, and is configured to convert an analog voltage S4, input to the tester pin $P_{IO}$ thus assigned, into a digital signal.

The parametric measurement unit 152 can be assigned to a desired channel selected from among the multiple channels CH1 through CHN. The parametric measurement unit 152 includes a voltage source, a current source, an ammeter, and a voltmeter. In the voltage application and current measurement mode, the parametric measurement unit 152 is configured to apply the voltage generated by the voltage source to the tester pin $P_{IO}$ of the channel thus assigned, and to measure the current that flows through the tester pin $P_{IO}$ of the channel. Furthermore, in the current application and voltage measurement mode, the parametric measurement unit 152 is configured to supply a current generated by the current source to the tester pin $P_{IO}$ of the channel thus assigned, and to measure the voltage at the tester pin $P_{IO}$ of the channel. The parametric measurement unit 152 allows the voltage and current to be measured at a desired pin.

The RAM 154 is provided in order to store the data to be used by each block of the tester hardware 100 or data generated by each block thereof. For example, the RAM 154 is used as pattern memory configured to store a digital signal pattern to be generated by the signal generator 142, as fail memory configured to store a pass/fail signal, as waveform memory configured to store waveform data which represents the waveform to be generated by the arbitrary waveform generator 148 or waveform data acquired by the digitizer 150.

The relay switch group 160 is connected to the tester pins $P_{IO1}$ through $P_{ION}$, the device power supply 140, the signal generators 142_1 through 142_N, the signal receivers 144_1 through 144_N, the arbitrary waveform generator 148, the digitizer 150, and the parametric measurement unit 152. The relay switch group 160 includes multiple relay switches in the internal configuration thereof, and is configured to assign the device power supply 140, the arbitrary waveform generator 148, the digitizer 150, and the parametric measurement unit 152 to a desired tester pin $P_{IO}$.

The internal bus 162 is provided in order to allow the blocks of the tester hardware 100 to transmit and receive signals between them. The kind of internal bus 162 and the number of bus lines of the internal bus 162 are not restricted in particular.

As described above, such an arrangement allows at least one of the functions of the blocks included in the tester hardware 100 to be modified according to the configuration data 306 stored in the nonvolatile memory 102.

The above is the configuration of the tester hardware 100. With such a tester hardware 100, by combining each of the blocks of the tester hardware 100, such an arrangement is capable of testing various kinds of semiconductor devices such as memory, a processor, an A/D converter, a D/A converter, etc., via various techniques. Description will be made below regarding the tests which can be provided by the test system 2 using the tester hardware 100.

1a. Memory Function Verification Test

In the memory function verification test, the device power supply 140, the signal generator 142, and the signal receiver 144 are mainly used. The device power supply 140 generates a power supply voltage to be supplied to the memory.

It should be noted that the power supply voltage may be supplied to the DUT 4 via a dedicated power supply line connected to the power supply pin of the memory without involving the relay switch group 160.

Each signal generator 142 is configured to generate a test pattern (address signal and data signal to be written) to be supplied to the memory. Each signal receiver 144 is configured to judge the level of the signal S2 read from the memory by comparing the signal level with an expected value, thereby performing pass/fail judgment. In addition, each signal receiver 144 is configured to judge whether or not the timing of the signal S2 thus received is normal.

1b. Memory DC Test

In the memory DC test, the device power supply 140 and the parametric measurement unit 152 are mainly used. The device power supply 140 is configured to generate a power supply voltage to be supplied to the memory. The device power supply 140 is configured to be capable of measuring the power supply voltage and the power supply current output from the device power supply 140 itself. The parametric measurement unit 152 is assigned to the tester pin $P_{IO}$ that corresponds to a desired pin of the memory, by means of the relay switch group 160. The device power supply 140 measures fluctuation in the power supply current and fluctuation in the power supply voltage. Furthermore, the parametric measurement unit 152 measures the leak current and the like at a desired pin.

Furthermore, by measuring the electric potential at a given tester pin and the current that flows via the given pin, such an arrangement is capable of calculating the impedance, which is the ratio between the electric potential and the current thus measured. Thus, such an arrangement can be used for detection of a contact fault or the like.

2a. Micro-Controller Function Verification Test (i) The function verification test for the memory included within the micro-computer can be performed using the same hardware configuration as in 1a.

(ii) The function verification test for the digital signal processing unit (CPU core) of the micro-controller can be performed using the same hardware configuration as in 1a.

2b. Micro-Controller DC Test

The DC test for the micro-controller can be performed using the same hardware configuration as in 1b.

3a. A/D Converter Function Verification Test

In the A/D converter function verification test, the device power supply 140, the arbitrary waveform generator 148, and at least one signal receiver 144 are mainly used. The arbitrary waveform generator 148 is assigned to the analog input terminal of the A/D converter by means of the relay switch group 160, and generates an analog voltage swept in a predetermined voltage range. At least one of the signal receivers 144 is assigned to a respective digital output terminal of the A/D convertor. Each signal receiver 144 thus assigned receives, from the A/D converter, a corresponding bit of a digital code that corresponds to the level of the analog voltage.

Such an arrangement is capable of evaluating the linearity (INL and DNL) of the A/D converter and the like based on the correlation between the digital code acquired by the signal receiver 144 and the analog voltage generated by the arbitrary waveform generator 148.

3b. A/D Converter DC Test

The DC test for an A/D converter can be performed using the same hardware configuration as in 1b.

4a. D/A Converter Function Verification Test

In the D/A converter function verification test, the device power supply 140, at least one of the signal generators 142, and the digitizer 150 are mainly used. The at least one of the signal generators 142 is respectively assigned to a corresponding digital input terminal of the D/A converter. Each signal generator 142 sweeps the input digital signal to be input to the D/A converter over its full-scale range.

The digitizer 150 is assigned to the analog output terminal of the D/A converter by means of the relay switch group 160, and is configured to convert the analog output voltage of the D/A converter into a digital code.

Such an arrangement is capable of evaluating the output voltage offset and the output voltage gain of a D/A converter based on the correlation between the digital code acquired by the digitizer 150 and the digital code generated by the signal generator 142.

4b. DC Test for D/A Converter

The DC test for a D/A converter can be made using the same hardware configuration as in 1b.

Such an A/D converter and a D/A converter may each be configured as a single separate IC, or may each be built into a micro-controller.

5. Oscilloscope Test

By assigning the digitizer 150 to a desired channel by means of the relay switch group 160, and by raising the sampling frequency of the digitizer 150, such an arrangement is capable of acquiring the waveform data of a signal that passes through the channel. By visualizing the waveform data by means of the information technology equipment 200, such an arrangement allows the test system 2 to function as an oscilloscope.

By means of the tester hardware 100, such an arrangement is capable of executing various kinds of function verification tests and various kinds of DC tests, in addition to those described above for exemplary purpose, which can be easily understood from those skilled in this art.

With a preferable embodiment, the tester hardware 100 is configured to change at least the pattern of the digital signal S1 generated by the signal generator 142 according to the configuration data 306 written to the nonvolatile memory 102. In this case, the nonvolatile memory 102 can be understood as being a part of the signal generator 142.

In this case, by selecting suitable configuration data according to the kind of device before the function verification test is performed for a device under test such as memory, a processor, an A/D converter, a D/A converter, etc., such an arrangement is capable of supplying an optimum digital signal to each device, thereby appropriately testing each device.

More specifically, the signal generator 142 is configured to selectively have a function as (i) an SQPG (Sequential Pattern Generator), (ii) an ALPG (Algorithmic Pattern Generator), and (iii) an SCPG (Scan Pattern Generator).

The SQPG function and the SCPG function may be provided by a single set of configuration data 306. Such an arrangement allows each signal generator 142 to be switched between the SQPG mode and SCPG mode in a given test. Also, such an arrangement allows a part of the channels of the signal generators 142 to be used as the SQPG while using another part of the channels of the signal generators 142 as the SCPG.

For example, in a case of performing a memory function verification test, by writing the configuration data 306 that corresponds to the ALPG to the nonvolatile memory 102, such an arrangement is capable of automatically generating a very long test pattern by means of calculation.

In a case of performing a function verification test for a processor (CPU or micro-controller) or the like, the configuration data 306 that corresponds to the SQPG function may preferably be written to the nonvolatile memory 102. With such an arrangement, a test pattern defined by the user according to the configuration of the processor or the like may be stored in the RAM 154 beforehand, and each signal generator 142 may read out the test pattern from the RAM 154, and may supply the test pattern thus read out to the DUT 4.

In a case in which the user desires to perform a boundary scan test, by writing the configuration data 306 that corresponds to the SCPG function to the nonvolatile memory 102, such an arrangement provides a test without involving the internal logic of the DUT 4.

Next, description will be made regarding a specific implementation of the tester hardware 100 shown in FIG. 6.

Figure 7:
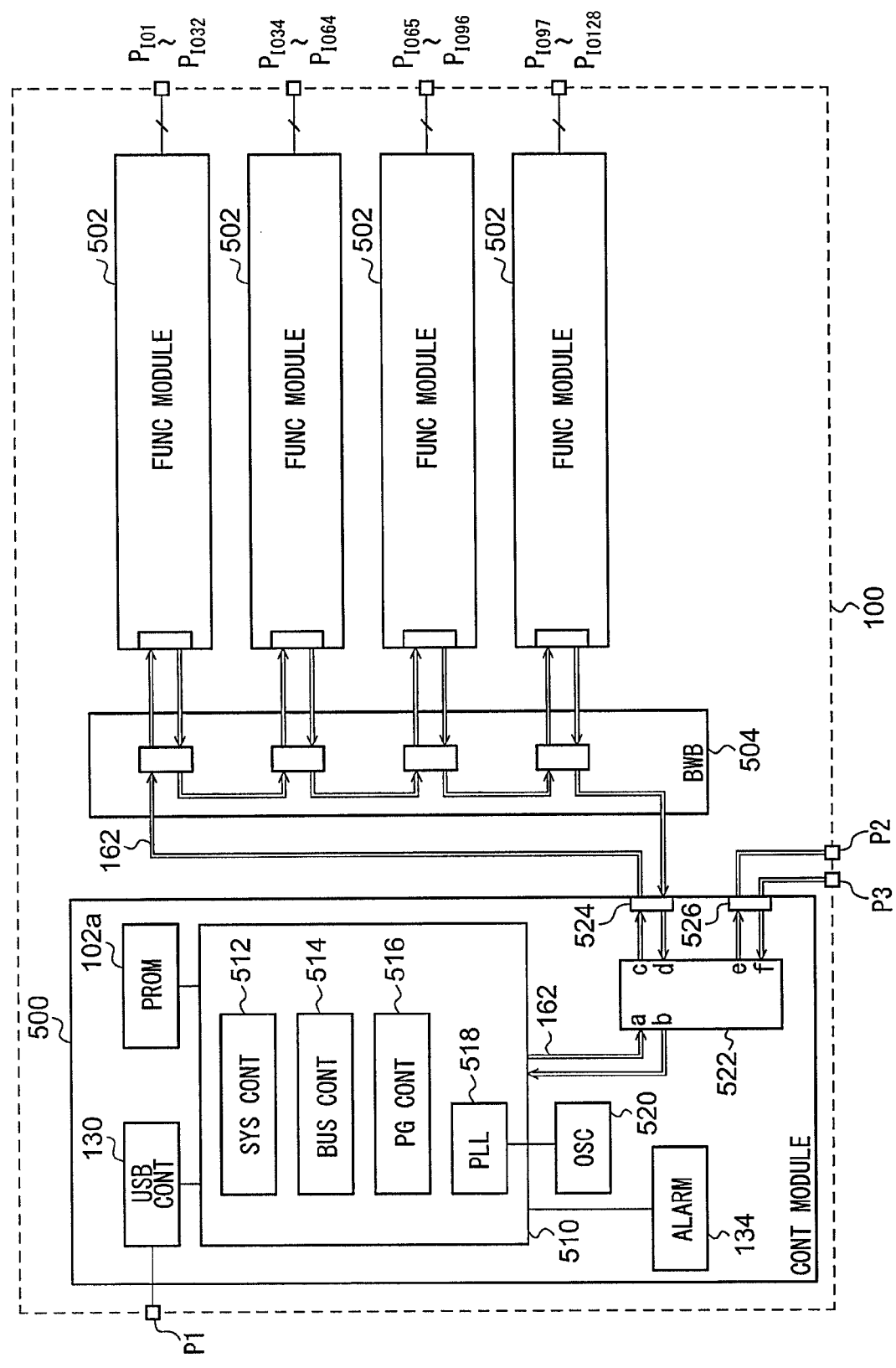
FIG. 7 is a diagram showing a specific example configuration of the tester hardware.

FIG. 7 is a diagram showing a specific example configuration of the tester hardware 100.

The tester hardware 100 mainly includes a control module 500, at least one function module 502, and a bus board 504. Each function module 502 is configured to provide a predetermined number of channels (32). The tester hardware 100 shown in FIG. 7 mounts four function modules 502, thereby providing 32×4=128 channels.

The information technology equipment 200 is connected to the bus port P1 via the bus 10. The control module 500 includes an interface unit 130, third nonvolatile memory 102c, a third programmable device 510, an oscillator 520, a bus selector 522, a main port 524, an expansion port 526, and an internal bus 162.

The internal bus 162 indicated by the double line is a bus configured to allow the tester hardware 100 to connect to a programmable device mounted on the tester hardware 100. The interface unit 130 is configured as described above.

A third programmable device 510 is configured to receive the third configuration data 306c from the information technology equipment 200 via the internal bus 162, and to write the third configuration data 306c thus received to the third nonvolatile memory 102c. The third programmable device 510 is configured such that its internal circuit information is defined according to the configuration data 306c stored in the third nonvolatile memory 102c.

After the configuration data 306c is loaded into the third programmable device 510, a system controller 512, a bus controller 514, and a PG controller 516 are configured as the internal components of the third programmable device 510.

It should be noted that the third programmable device 510 provides the same functions regardless of the kind of DUT and the test items. Thus, the third configuration data 306c may be written to the third nonvolatile memory 102c beforehand when the tester hardware 100 is distributed. It should be noted that, in some cases, the third configuration data 306c downloaded from the server 300 may be written to the third nonvolatile memory 102c for the purpose of function extension or debugging after shipment.

As described above, the abnormality detection unit 134 is configured to detect a power supply abnormality and a temperature abnormality. The system controller 512 is configured to integrally control the overall operation of the tester hardware 100 according to a control command received from the information technology equipment 200 and a detection result obtained by the abnormality detection unit 134.

The bus controller 514 is configured to control data transmission/reception between each of the blocks via the internal bus 162.

The PG (Pattern Generator) controller 516 is connected to a pattern generator of each channel via a control line (not shown) that differs from the internal bus 162, and is configured to transmit a PG start signal to each pattern generator in response to a control command received from the information technology equipment 200. Furthermore, the PG controller 516 is configured to receive a flag signal (which will also be referred to as a "control signal" or an "interrupt signal") generated by each pattern generator, and to return the information with respect to the flag signal to the information technology equipment 200.

A PLL (Phase Locked Loop) 518 is a circuit provided to the third programmable device 510 as a standard built-in component, and is configured to receive a reference clock from an external oscillator 520, and to generate a cyclic signal that corresponds to the test cycle. Each internal block included in the tester hardware 100 is controlled in synchronization with the cyclic signal.

The bus port of the third programmable device 510 is connected to the multiple function modules 502 via the internal bus 162, and more specifically is connected in series to the internal programmable devices included in the function modules 502 so as to form a ring-shaped circuit.

The bus board 504 is configured as a so-called back wiring board (BWB). The internal bus 162 that connects the control modules 500 and the multiple function modules 502 is formed on the bus board 504. Each function module 502 is connected to a corresponding tester pin $P_{IO}$, and is connected to the internal bus 162.

With the present embodiment, the tester hardware 100 includes a send port P2 and a return port P3. Such an arrangement is configured to allow the send port P2 of a given tester hardware 100 to be connected to the return port P3 of a different tester hardware 100 via the bus 162. Furthermore, the tester hardware 100 is configured to be switched between the master mode and the slave mode. Thus, by linking together the multiple tester hardware 100, and by setting a leading tester hardware 100 to the master mode, and setting the other tester hardware 100 to the slave mode, such an arrangement is capable of controlling the multiple tester hardware 100 using the single information technology equipment 200.

In order to provide a function for switching the mode of the tester hardware 100 between the master mode and the slave mode, the control module 500 includes the bus selector 522, the main port 524, and the expansion port 526. The main port 524 is connected to the bus board 504. The expansion port 526 is connected to the send port P2 and the return port P3.

The bus selector 522 includes a first port a and a second port b each connected to the control module 500, a third port c and a fourth port d each connected to the main port 524, and a fifth port e and a sixth port f each connected to the expansion port 526.

The bus selector 522 is configured to be switchable between: a first state in which the ports a and c are connected to each other, and the ports d and b are connected to each other; a second state in which the ports a and c are connected to each other, the ports d and e are connected to each other, and the ports f and b are connected to each other; and a third state in which the ports a and b are connected to each other.

In a case of using a single tester hardware 100, the bus selector 522 is preferably set to the first state. In this state, the expansion ports P2 and P3 are each disabled. In a case of using multiple tester hardware 100 linked together, the bus selector 522 is preferably set to the second state.

Such an arrangement is configured to allow the on/off control operation of the power supply for each function module 502 to be performed independently of the on/off operation of the power supply for the control module 500. Specifically, the on/off control operation of the power supply for each function module 502 is controlled by the control module 500. With such a configuration, when the power supply for a given function module 502 is off, data transmission cannot be made via the given function module 502. In order to solve such a problem, when the power supply for a given function module 502 is off, the control module 500 connected to the given function module 502 is set to the third state, which sets the internal bus 162 to a closed state in the control module 500. The control module 500 may control the power supplies for the multiple function modules 502 collectively. Also, the control module 500 may control the power supplies for the multiple function modules 502 independently and separately.

Figure 8:
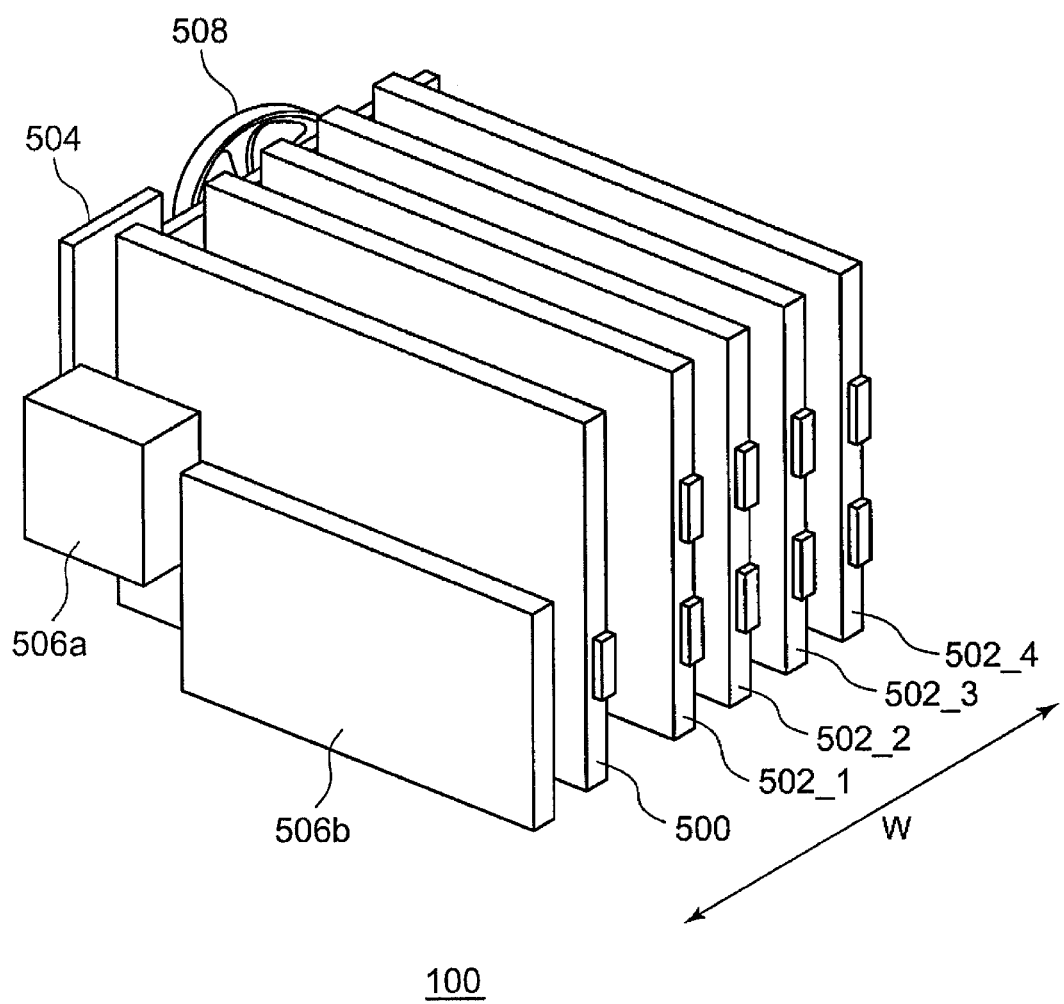
FIG. 8 is a perspective view showing an internal layout of the tester hardware.

FIG. 8 is a perspective view showing the internal layout of the tester hardware 100. A noise filter 506a is configured to receive an AC voltage from a commercial AC power supply via the AC plug 110 shown in FIG. 5, and to remove noise from the AC voltage thus received. A power supply board 506b mounts an AC/DC converter (inverter) configured to convert an AC voltage into a DC voltage. The DC voltage generated by the power supply board 506b is supplied to the control module 500, the function modules 502, and the like.

The control module 500 and the multiple function modules 502 are arranged in parallel within a casing of the tester hardware 100. A cooling fan 508 is provided on the back side of the tester hardware 100, and is configured to cool the function modules 502.

Furthermore, the bus board 504 is provided on the respective rear sides of the control module 500 and the multiple function modules 502. With such a structure, by changing the width W of the tester hardware 100 and by changing the number of function modules 502, such an arrangement allows the number of channels to be changed in a simple manner.

Figure 9:
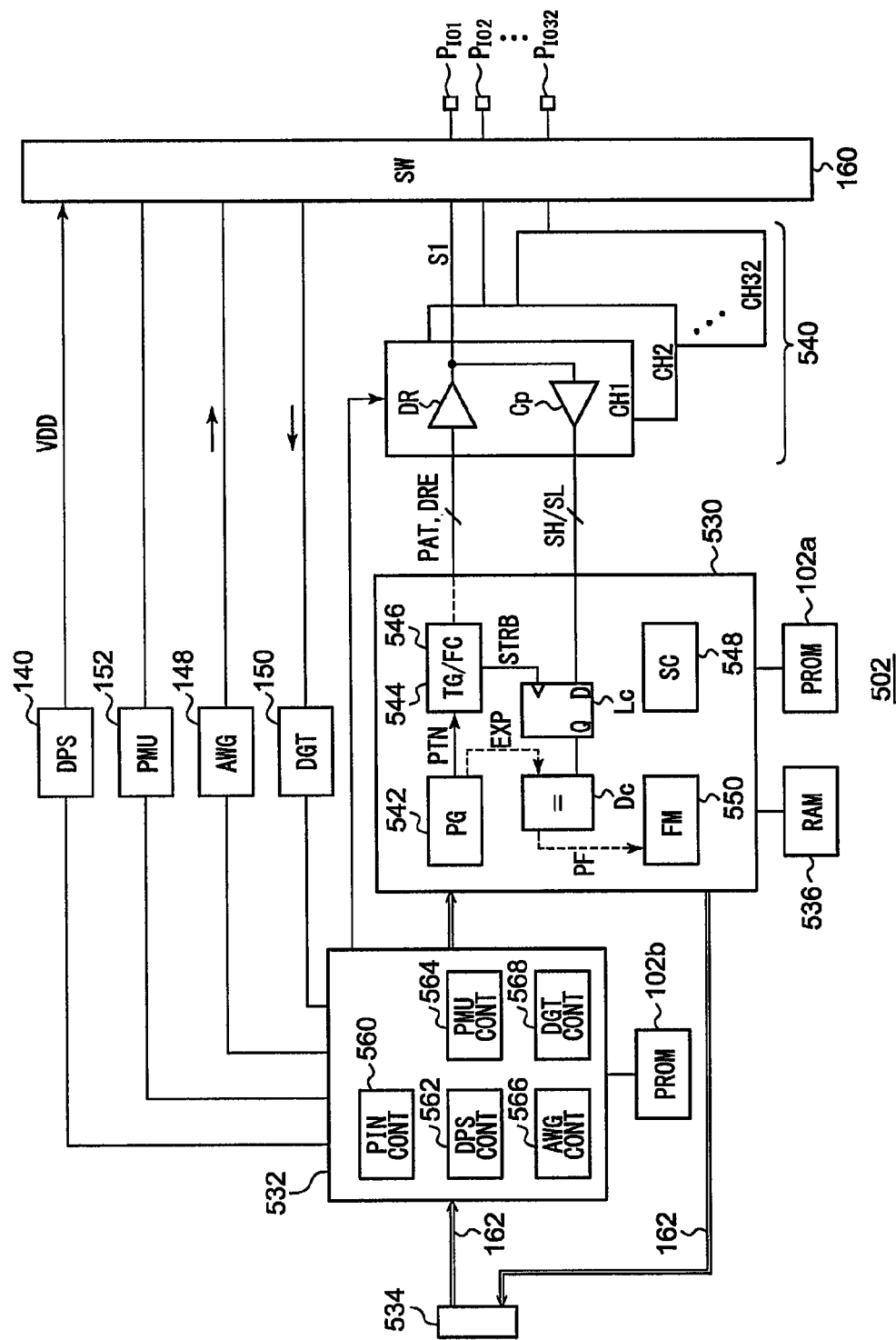
FIG. 9 is a block diagram showing a specific example configuration of a function module.

FIG. 9 is a block diagram showing a specific example configuration of the function module 502. The function module 502 includes a first programmable device 530, a second programmable device 532, a bus port 534, first nonvolatile memory 102a, second nonvolatile memory 102b, volatile memory 536, a pin electronics section 540, and an internal bus 162. The device power supply 140, the parametric measurement unit 152, the arbitrary waveform generator 148, and the digitizer 150 have the same configurations and perform the same operations as those described above with reference to FIG. 6.

The pin electronics section 540 includes multiple drivers Dr and multiple voltage comparators Cp. The multiple drivers Dr are respectively provided to the channels. Each driver Dr is arranged such that a pattern signal PAT is received via its input terminal, and a driver enable signal DRE is received via its enable terminal. When the driver enable signal DRE is asserted, the driver Dr is configured to output a test pattern having a voltage level that corresponds to the pattern signal PAT. Furthermore, each driver Dr is configured such that, when the driver enable signal DRE is negated, the output of the driver Dr is set to the high-impedance state. The pin electronics section 540 includes a certain number of D/A converters (not shown in FIG. 9) as described later.

The multiple voltage comparators Cp are respectively provided the channels. Each voltage comparator Cp is configured to compare the voltage level of the digital signal input from the DUT 4 via the corresponding tester pin $P_{IO}$ with a predetermined high threshold voltage VTHH and a low threshold voltage VTHL, and to generate comparison signals SH and SL indicating the respective comparison results.

The multiple channels of the drivers Dr and the voltage comparators Cp may be monolithically integrated as a single semiconductor chip, or otherwise may be configured in a single semiconductor module.

The first nonvolatile memory 102a is configured as rewritable memory, and is configured to store the first configuration data 306a. Such an arrangement is configured to allow the first programmable device 530 to receive the first configuration data 306a from the information technology equipment 200 via the internal bus 162, and to write the first configuration data 306a thus received to the first nonvolatile memory 102a. Furthermore, the circuit information with respect to the internal circuit configuration of the first programmable device 530 is defined by the configuration data 306a stored in the first nonvolatile memory 102a.

The first programmable device 530 is connected to the respective input terminals and the respective enable terminals of the multiple drivers Dr, the respective output terminals of the multiple voltage comparators Cp, and the volatile memory 536.

In a state in which the first configuration data 306a is loaded into the first programmable device 530, (1) multiple latch circuits Lc, (2) multiple digital comparators Dc, (3) a pattern generator 542, (4) a timing generator 544, (5) a format controller 546, (6) a sense controller 548, and (7) a fail memory controller 550 are configured as the internal components of the first programmable device 530.

The pattern generator 542 is configured to generate pattern data PTN which defines pattern signals PAT to be respectively output to the multiple drivers Dr, the driver enable signals DRE to be respectively output to the multiple drivers Dr, and expected value data EXP to be respectively output to the multiple digital comparators Dc.

As described above, the pattern generator 542 is connected to the PG controller 516 of the control module 500 via a control line that differs from the internal bus 162. The state of the pattern generator 542 of each channel is controlled by the PG controller 516 via this control line, and is transmitted as a notice to the PG controller 516 via this control line.

The timing generator 544 is configured to control the timing of the signal processing performed by the first programmable device 530. For example, the timing generator 544 is configured to generate a rate signal RATE which defines the test period, a timing signal TMG which defines the positive edge timing or the negative edge timing of the pattern signal PAT, and a strobe signal STRB, and the like.

The format controller (waveform shaper) 546 is configured to generate a pattern signal PAT based on the pattern data PTN and the timing signal TMG. The pattern signal PAT is configured to have a level that corresponds to the pattern data PTN, and such that the timing of each edge corresponds to the timing signal TMG. Furthermore, the format controller 546 is configured to control the signal format (NRZ format, RZ format, differential format, bipolar format, etc.) of the pattern signal PAT.

The pattern generator 542, the timing generator 544, the format controller 546, and the driver Dr together correspond to the signal generator 142 shown in FIG. 6. As described above, each signal generator 142 is configured to be capable of changing the pattern of the digital signal S1 according to the configuration data 306. With such an arrangement, the pattern data PTN generating method to be executed by the pattern generator 542 can be changed according to the first configuration data 306a written to the first nonvolatile memory 102a, thereby providing such a function.

More specifically, the pattern generator 542 is configured to be capable of selecting at least one configuration from among the SQPG (Sequential Pattern Generator), ALPG (Algorithmic Pattern Generator), and SCPG (Scan Pattern Generator), according to the first configuration data 306a.

The multiple latch circuits Lc are respectively provided to the channels (the voltage comparators Cp), and are each configured to latch the comparison signals SH and SL received from the corresponding voltage comparator Cp at a timing of the strobe signal STRB.

The multiple digital comparators Dc are respectively provided for the channels (the latch circuits Lc), and are each configured to compare the data latched by the corresponding latch circuit Lc with the corresponding expected value data EXP, and to generate a pass/fail signal PF which indicates whether or not the data accords with the expected data.

The sense controller 548 is configured to control the cycle and the edge timing of the expected value comparison made by the digital comparator Dc.

The fail memory controller 550 is configured to store the pass/fail signals PF, which are output from the multiple digital comparators Dc, in the volatile memory 536 configured as fail memory.

The voltage comparator Cp, the latch circuit Lc, the digital comparator Dc, the pattern generator 542, and the timing generator 544 together correspond to the signal receiver 144 shown in FIG. 6.

The second nonvolatile memory 102b is configured as rewritable memory, and is configured to store the second configuration data 306b. Such an arrangement is configured to allow the second programmable device 532 to receive the second configuration data 306b from the information technology equipment 200 via the internal bus 162, and to write the second configuration data 306b thus received to the second nonvolatile memory 102b. Furthermore, the circuit information with respect to the internal circuit configuration of the second programmable device 532 is defined by the configuration data 306b stored in the second nonvolatile memory 102b.

The second programmable device 532 is connected to the first programmable device 530, the pin electronics section 540, the device power supply 140, the parametric measurement unit 152, the arbitrary waveform generator 148, and the digitizer 150.

In a state in which the second configuration data 306b is loaded into the second programmable device 532, a pin controller 560, a device power supply controller 562, a DC controller 564, a waveform generator controller 566, and a digitizer controller 568 are configured as the internal components of the second programmable device 532.

Figure 10:
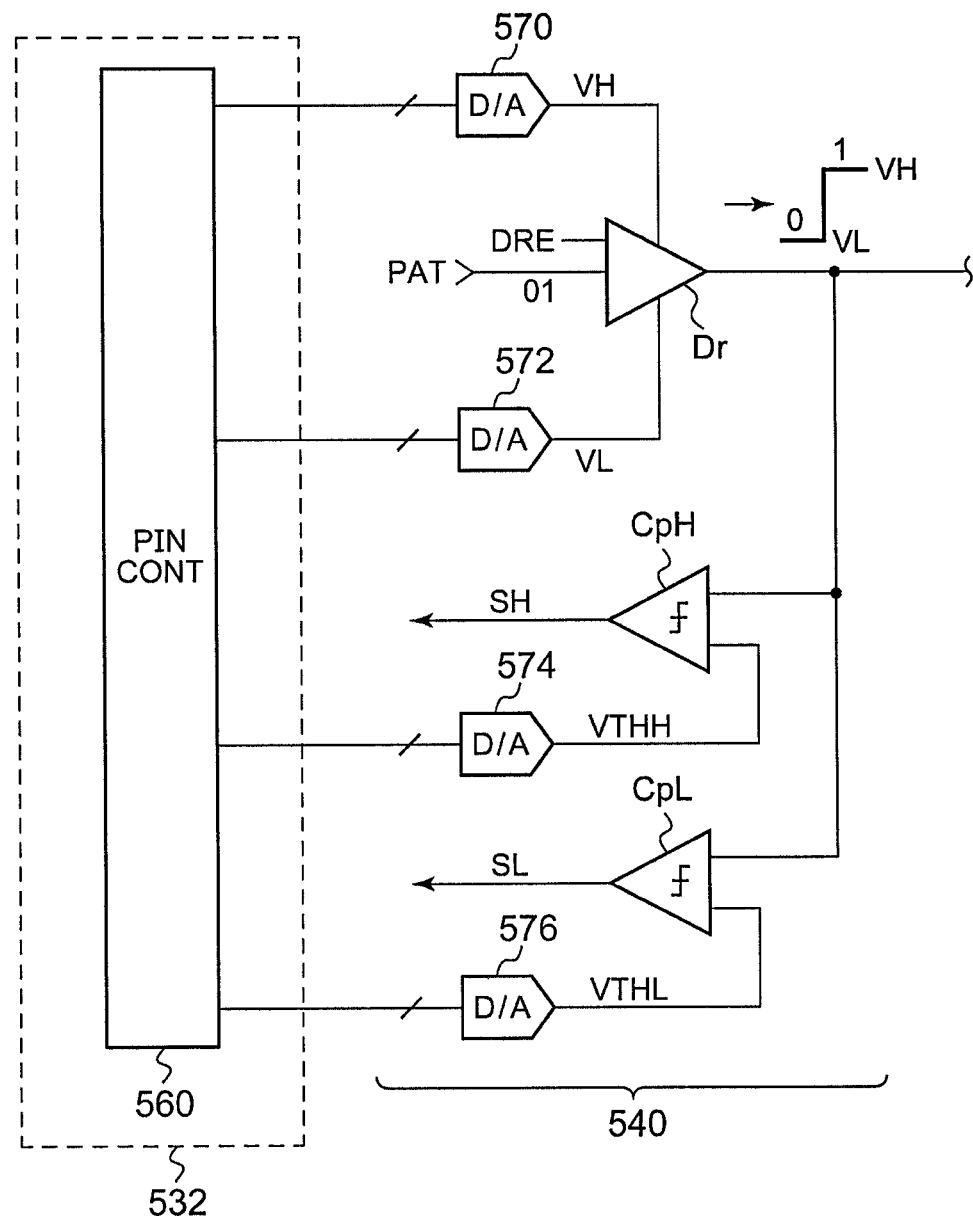
FIG. 10 is a circuit diagram showing a specific configuration of a pin electronics section.

FIG. 10 is a circuit diagram showing a specific configuration of the pin electronics section 540. FIG. 10 shows a configuration of a single channel.

A first D/A converter 570 is configured to generate the high power supply voltage VH to be supplied to the corresponding driver Dr. A second D/A converter 572 is configured to generate a low power supply voltage VL to be supplied to the corresponding driver Dr. The driver Dr is configured to output a voltage level VL when PAT=0 is input, and to output a voltage level VH when PAT=1 is input.

The comparator CpH is configured to compare the signal received from the DUT 4 with the high threshold voltage VTHH. The comparator CpL is configured to compare the signal received from the DUT 4 with the low threshold voltage VTHL. The third D/A converter 574 is configured to generate the high threshold voltage VTHH. The fourth D/A converter 576 is configured to generate the low threshold voltage VTHL.

The pin controller 560 included in the second programmable device 532 is configured to output the control values indicating VH, VL, VTHH, and VTHL to the input terminals of the first D/A converter 570, the second D/A converter 572, the third D/A converter 574, and the fourth D/A converter 576, respectively.

Returning to FIG. 9, based on the control data received from the information technology equipment 200, the device power supply controller 562, the DC controller 564, the waveform generator controller 566, and the digitizer controller 568 are configured to control the device power supply 140, the parametric measurement unit 152, the arbitrary waveform generator 148, and the digitizer 150, respectively.

With the functional module 502, the internal bus 162 is configured such that, from the bus port 534, it passes through the second programmable device 532 and the first programmable device 530, and returns to the bus port 534. It should be noted that the order of the second programmable device 532 and the first programmable device 530 is exchangeable.

The tester hardware 100 described with reference to FIGS. 7 through 10 provides the following advantages.

First, by preparing the first configuration data 306a such that the pattern generator 542, the timing generator 544, and the format controller 546 are each configured to have a desired function according to the kind of DUT 4, the test items, and the like, and by writing the first configuration data 306a thus prepared to the memory, such an arrangement is capable of supplying a suitable digital signal to various kinds of DUT 4.

Second, by using a programmable device for integral configuration of the multiple latch circuits Lc, the multiple digital comparators Dc, the pattern generator 542, the timing generator 544, and the format controller 546, such an arrangement provides a tester hardware having a reduced size.

Third, by configuring the fail memory controller 550 as an internal component of the first programmable device 530, such an arrangement allows the first programmable device 530 to perform all of a digital processing series, such as supplying a digital signal to the DUT 4 and judging whether or not a read-out digital signal exhibits a normal level. As a result, such an arrangement allows the tester hardware 100 to perform the control operation in a simple manner according to the test program.

Fourth, each block of the function module 502 is configured as a separate block such as the first programmable device 530 and the second programmable device 532. With such a configuration, the first programmable device 530 performs a digital processing series, such as supplying a digital signal to the DUT 4 and judging whether or not a read-out digital signal exhibits a normal level. On the other hand, the second programmable device 532 controls the other analog devices. As a result, the design or debugging of the tester hardware 100 can be performed separately for the control operation of the digital block and the control operation of the analog block, thereby providing improved design efficiency.

Fifth, by configuring the tester hardware 100 to have a desired number of function modules 502, such an arrangement allows the designer to design the tester hardware 100 having a desired number of channels in a simple manner according to the number of function modules 502.

Sixth, the first programmable devices 530 and the second programmable devices 532 included in the respective function modules 502 are connected in series (so as to form a ring-shaped circuit) via the internal bus 162. Such a configuration allows the same configuration data to be written to the respective first nonvolatile memory 102*a* included in the multiple function modules 502, and allows the same configuration data to be written to the respective second nonvolatile memory 102*b* of the multiple function modules 502.

In most cases, the multiple function modules 502 are connected to the same DUT. Thus, in many cases, the configuration data and the control instructions are the same for the multiple function modules 502. Thus, by connecting the first programmable devices 530 and the second programmable devices 532 in series, such an arrangement allows the configuration data to be supplied to each programmable device with high efficiency.

For example, a device control bit that indicates the destination devices 532 and 532 is assigned to the first data to be transmitted through the internal bus 162. Each device judges that the subsequent data after the device control bit is to be processed by the device itself when the device control bit specifies the device itself. With the configuration shown in FIG. 7, the eight devices 532, 530, 532, 530, 532, 530, 532, and 530 are connected in this order from the upstream side of the internal bus 162. With such an arrangement, the device control bit may be configured as eight-bit data, the most significant bit may be assigned to the leading device 532, and the least significant bit may be assigned to the last device 530, for example. Each device judges that the subsequent data from the device control bit is transmitted to the device itself when the corresponding bit is 1.

In a case in which common data is to be transmitted to all the devices, the device control bits are all set to 1, and the common data to be transmitted is set as the subsequent data. Such an arrangement allows the third programmable device 510 to supply the common data to all the devices by transmitting data only once.

Description has been made in the embodiment regarding an arrangement in which the multiple latch circuits, the multiple digital comparators, the pattern generator, the timing generator, and the format controller are configured by means of the single first programmable device 530. Also, such components may be configured by means of multiple separate first programmable devices 530. With such an arrangement, each first programmable device may be configured as a low-cost programmable device required to have only a small number of gates. Thus, in a case in which such an arrangement has an advantage of a reduced total cost, such internal components may be divided into the multiple programmable devices. Specifically, the pattern generator, the timing generator, and the format controller may be configured in a single programmable device, and the multiple latch circuits and the multiple digital comparators may be configured in a different programmable device.

The above is the configuration of the test system 2.

Figure 11:
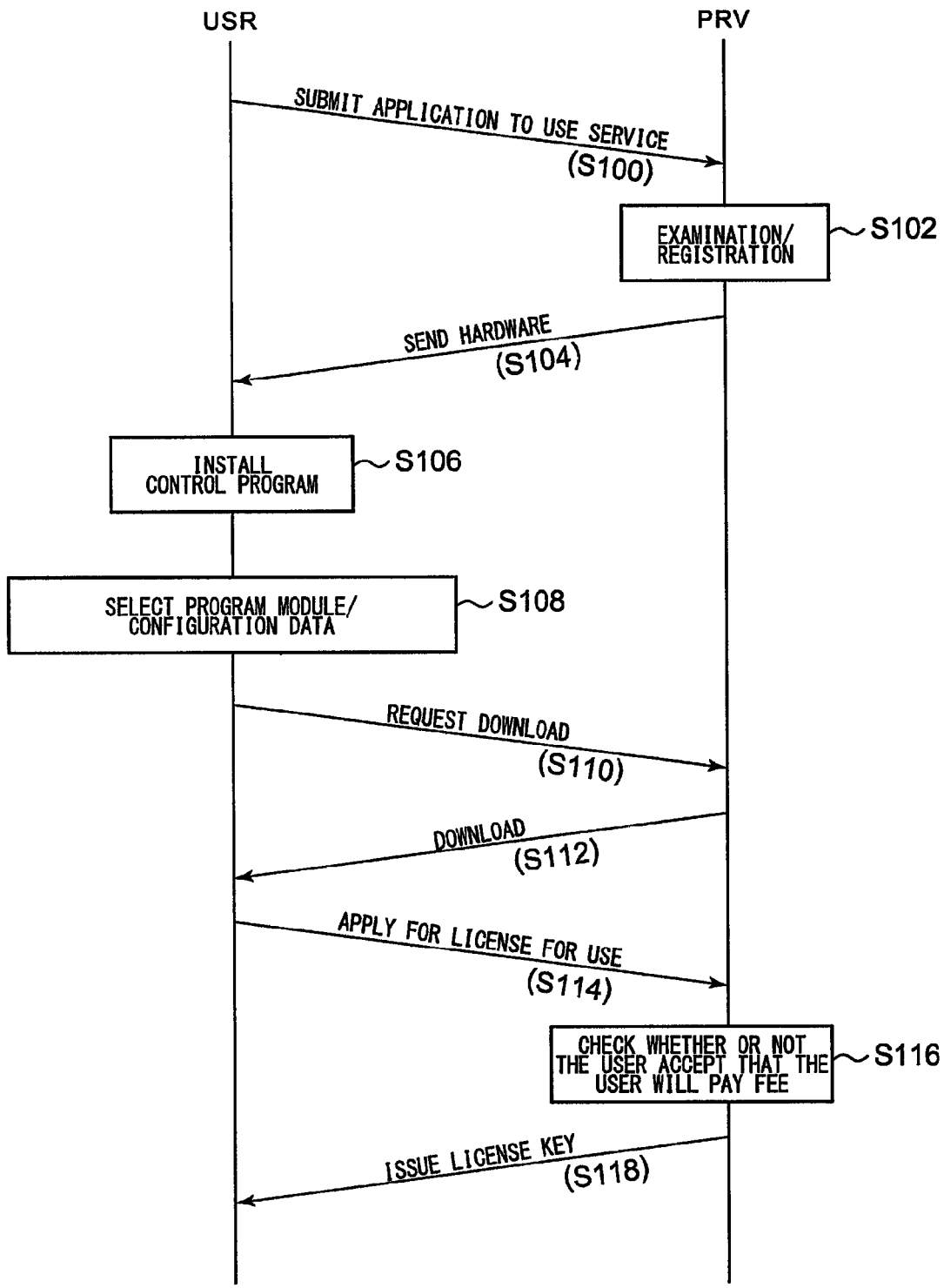
FIG. 11 is a diagram showing the flow of a cloud testing service.

Next, description will be made regarding the flow of the cloud testing service. FIG. 11 is a diagram showing the flow of the cloud testing service.

The user USR submits an application to use the cloud testing service to the service provider PRV (S100). In the application submission, the information with respect to the user USR is transmitted to the server 300 of the service provider PRV.

The service provider PRV performs an examination based on a credit check of the user USR or the like (S102). When the user USR satisfies predetermined conditions in the examination, the user USR is registered in the database as a user of the cloud testing service, and a user ID is assigned to the user USR. In the registration, the user notifies the service provider PRV of the identification information for the information technology equipment 200 personally used by the user USR as the test system 2. The identification information for the information technology equipment 200 is also registered in the database of the server 300. The MAC address of the information technology equipment 200 may be used as the identification information for the information technology equipment 200.

The service provider PRV sends the tester hardware 100 to the user USR who has been registered (S104). From the viewpoint of the service provider PRV side desiring to widely disseminate the test system 2, and from the viewpoint of the user USR side desiring to construct the test system at a low cost, the service provider PRV and the user USR may conclude a contract whereby the provider PRV lends the tester hardware 100 without compensation. In this case, it is needless to say that the user USR is prohibited from modifying or dismantling the tester hardware 100.

The user USR accesses and logs into the website established by the service provider PRV, downloads the control program 302, and installs the control program 302 thus downloaded on the registered information technology equipment 200 (S106). It should be noted that the service provider PRV may license only the information technology equipment 200 that has been registered to use the control program 302. Also, the control program 302 may be distributed in a state in which it is stored on a medium such as a CD-ROM, DVD-ROM, or the like.

After the user USR performs the aforementioned steps, the user USR is able to construct the test system 2 using the tester hardware 100 and the information technology equipment 200.

When the user USR desires to set up the test system 2, the user USR accesses and logs into the website. The list of the program modules 304 and the configuration data 306 that can be downloaded is posted on the website. Next, the user USR selects the program module 304 and the configuration data 306 suitable for the kind of DUT 4 to be tested and the test content (S108), and requests to download this program module 304 and this configuration data 306 (S110). Upon receiving the request, the server 300 supplies the program module 304 and the configuration data 306 to the information technology equipment 200 (S112).

Furthermore, the user USR applies to the server 300 of the service provider PRV for approval to use the desired program module 304 and the desired configuration data 306 (S114).

The fee for the program module 304 and the fee for the configuration data 306 are set according to the duration of use. When the user USR accepts that the user USR will pay the fee (S116), the service provider PRV issues a license key which licenses the user USR to use such a software component for each program module 304 and for each configuration data 306 (S118).

The license key for the configuration data 306 will be referred to as the "first license key KEY1", and the license key for the program module 304 will be referred to as the "second license key KEY2", for the purpose of distinguishing them from each other.

The first license key KEY1 licenses the user USR to use the requested configuration data 306 only on the information technology equipment 200 that has been specified by the user USR and registered beforehand in the database. The first license key KEY1 includes data which indicates the configuration data 306 to be licensed, the identification information for the information technology equipments to be licensed, and data which indicates the license period during which the user USR is licensed to use the configuration data 306. It is needless to say that the first license key is encrypted.

Similarly, the second license key KEY2 licenses the user USR to use the requested program module 304 only on the information technology equipment 200 that has been specified by the user USR and registered beforehand in the database. The second license key KEY2 includes data which indicates the program module 304 to be licensed, the identification information for the information technology equipmentes to be licensed, and data which indicates the license period during which the user USR is licensed to use the program module 304. It is needless to say that the second license key KEY2 is also encrypted.

Here, a modification may be made in which the user USR may be licensed indefinitely, instead of a predetermined license period being set.

The above is the configuration of the test system 2. Next, description will be made regarding the operation of the test system 2.

After the flow shown in FIG. 11, the information technology equipment 200 stores the control program 302 and the program module 304. Furthermore, the configuration data 306 is written to the nonvolatile memory 102 included in the tester hardware 100.

Before the user USR uses the test system 2, the user USR connects the information technology equipment 200 and the tester hardware 100 to each other via the bus 10. Next, the user USR turns on the power supply for the tester hardware 100, thereby starting up the control program 302 on the information technology equipment 200.

The information technology equipment 200 performs authentication of the configuration data 306. Also, the authentication of the configuration data 306 may be performed when the control program 302 is started up.

The hardware access unit 212 shown in FIG. 2 acquires the information with respect to the configuration data 306 stored in the nonvolatile memory 102 included in the tester hardware 100. The authentication unit 214 refers to the first license key KEY1 issued for the configuration data 306. If the first license key KEY1 exists, judgment is made whether or not the identification information for the information technology equipment included in the license key KEY1 agrees with the information technology equipment 200 currently being used by the user USR, and whether or not the current time point is within the license period. When the identification information agrees with the information technology equipment 200 currently being used by the user, and the current time point is within the license period, the authentication unit 214 judges that the user USR is licensed to use the configuration data 306 on the information technology equipment 200, and licenses the user USR to use the configuration data 306 stored in the nonvolatile memory 102 on the tester hardware 100. With such an arrangement, only after the first license key KEY1 has been issued, the user USR is able to operate the tester hardware 100 according to the configuration data 306. If the period of the license of use has expired, the user is prompted to apply for a renewed contract to use the configuration data 306.

Furthermore, the information technology equipment 200 performs authentication of the program module 304. Specifically, the authentication unit 214 refers to the second license key KEY2 issued for the respective program modules 304 according to the user's request. If the second license key KEY2 exists, judgment is made whether or not the identification information for the information technology equipment included in the second license key KEY2 agrees with the information technology equipment 200 currently being used by the user. When the identification information agrees with the information technology equipment 200 currently being used by the user, the authentication unit 214 judges that the user is licensed to use the program module 304 on the information technology equipment 200, and approves the user to embed the program module 304 in the control program 302.

With such an arrangement, in some cases, the kind of DUT to be supported by the configuration data 306 stored in the nonvolatile memory 102 is not consistent with the program module 304 to be embedded in the test program 240. Examples of such a case include a case in which the configuration data 306 is configured to support a memory test, and the test algorithm module 304*a* is configured as a linearity verification program for evaluating the function of the A/D converter. In this case, the DUT 4 configured as memory cannot be tested. In order to solve such a problem, such an arrangement is preferably provided with a function of checking the consistency between the program module 304 and the configuration data 306. When such a consistency result cannot be obtained, the information technology equipment 200 notifies the user of the inconsistency result, thereby ensuring the test using the correct program module 304 and configuration data 306.

After the aforementioned steps, the information technology equipment 200 is able to execute a test according to the test program 240.

The execution unit 220 controls the tester hardware 100 based on the test program 240 mainly composed of the control program 302 and the test algorithm module 304*a*. The data obtained as a result of the test is transmitted from the tester hardware 100 to the information technology equipment 200, and is stored in the storage apparatus 206.

Furthermore, using an analysis method defined by the analysis tool module 304*b*, the analyzing unit 230 analyzes the data acquired by the tester hardware 100.

The above is the operation of the test system 2. The test system 2 has the following advantages as compared with conventional test apparatuses.

1. With the test system 2, the tester hardware 100 does not have a dedicated configuration limited to a particular device or particular test content. Rather, the test system 2 is designed to have high versatility which allows various kinds of test content to be provided. With such an arrangement, various kinds of configuration data optimized for various kinds of devices to be tested and optimized for various kinds of test content are prepared by the service provider or a third party, and are stored in the server 300.

By selecting the optimum configuration data 306 for the DUT 4 to be tested, and by writing the configuration data 306 thus selected to the nonvolatile memory 102 included in the tester hardware, such an arrangement allows the user USR to appropriately test the DUT 4.

That is to say, with the test system 2, there is no need to prepare a dedicated test apparatus (hardware) for each kind of DUT 4 or each test item, thereby providing a reduced cost for the user.

2. If a new test that has not previously existed is required after a device is newly developed, the configuration data 306 and the program module 304 configured to support the new test content can be provided by the service provider PRV or by a third party. Thus, for devices that are within the range of the processing capacity of the tester hardware, the test system 2 allows the user to test devices from currently developed devices to devices that will be developed in the future.

3. With conventional techniques, before a semiconductor device in the development phase is tested, there is a need to prepare a power supply apparatus, an arbitrary waveform generator, and an oscilloscope or a digitizer, each configured as separate components, and to combine the separate components thus prepared so as to measure desired characteristics of the device. In contrast, with the test system 2 according to the embodiment, by preparing only the information technology equipment 200 and the tester hardware 100, such an arrangement allows the user to appropriately test various kinds of semiconductor devices in a simple manner.

4. If the tester hardware 100 is used in the development phase, the tester hardware 100 can be designed assuming that the number of devices to be tested at the same time is smaller, i.e., designed with a reduced number of channels. Furthermore, the tester hardware 100 can be designed assuming that it will operate in cooperation with the information technology equipment. Moreover, the tester hardware 100 can be designed with a part of the functions omitted as necessary. This allows the tester hardware 100 to be configured with a low cost and with a very compact size, as compared with conventional test apparatuses for the mass production phase. Specifically, this allows the tester hardware 100 to be configured with a desktop size or a portable size.

From the viewpoint of the user USR, such an arrangement allows each researcher or each developer or otherwise each researcher/developer group to personally possesses the tester hardware 100. From the viewpoint of the service provider PRV, such an arrangement allows the tester hardware 100 to become popular, thereby expanding its business.

5. Conventional test apparatuses have a large size, which in practice does not allow the user to move such a large-size test apparatus. Instead, the user must move the DUT 4 to the conventional test apparatus. In contrast, with the tester hardware 100 configured to have a reduced size, such an arrangement allows the user to move the tester hardware 100 to the location of the device under test.

For example, let us consider a case in which the user desires to test a device under test in a clean room. In a case in which there is a long distance between the position at which the test apparatus is installed and the device under test, moving the device over a long distance is undesirable giving consideration to device contamination even if the device is transferred in a clean room. That is to say, with conventional techniques, in some cases, neither the device under test nor the test apparatus can be moved, which is a problem. Thus, in some cases, the usage of the test apparatus is limited. In contrast, the test system 2 according to the embodiment can be installed in various positions in a clean room. Also, such a test system 2 can be brought into the clean room, and can be taken out from the clean room. Also, such an arrangement allows the user to perform a test in a special environment outdoors. That is to say, such an arrangement dramatically extends the conditions in which the test apparatus can be used, as compared with conventional techniques.

6. With the test system 2, the service provider PRV prepares various kinds of program modules 304 on the server 300 configured as a cloud system. Such an arrangement allows the user USR to select a suitable one from among the program modules 304 thus prepared according the kind of semiconductor device, the test items, and the evaluation algorithm, and to embed the program module 304 thus selected in the test program 240. As a result, such an arrangement allows the user USR to appropriately test a device without a need to develop a test program, unlike conventional techniques.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Description has been made in the embodiment regarding an arrangement in which the license key is employed to license the registered information technology equipment 200 to use the program module 304 and the configuration data 306.

In contrast, with a first modification, instead of the information technology equipment 200, the tester hardware 100 specified by the user is licensed to use the program module 304 and the configuration data 306. With such an arrangement, the first license key KEY1 includes identification information with respect to the configuration data 306 to be licensed and identification information with respect to the tester hardware 100 to be licensed to use the configuration data 306.

When the user USR starts up the test program 240, the authentication unit 214 acquires the ID of the tester hardware 100. When the first license key KEY1 agrees with the ID thus acquired, the system is able to read out the configuration data 306 from the nonvolatile memory 102, and the tester hardware 100 is able to operate according to the configuration data 306 thus read out. The operation using the second license key KEY2 is performed in a similar manner.

Also, the service provider PRV may provide a hardware key (which is also referred to as "dongle") to the user USR. Also, an arrangement may be made in which, only when the hardware key is connected to the information technology equipment 200, the user USR is able to use the program module 304 and the configuration data 306.

[Second Modification]

Description has been made in the embodiment regarding an arrangement in which the program modules 304 and the configuration data 306 are stored in the server 300, and the user is respectively and separately licensed for the program modules 304 and for the configuration data 306. However, the present invention is not restricted to such an arrangement. Also, the server 300 may store either a group of the program modules 304 or a group of the configuration data 306 such that each program module or each configuration data can be downloaded. Such an arrangement also allows the user to appropriately test various kinds of devices according to a test algorithm and an evaluation algorithm according to the user's request.

[Third Modification]

Description has been made in the embodiment regarding an arrangement in which the information technology equipment 200 is configured to execute authentication and a test program.

In contrast, with a third modification, the server 300 may perform an authentication operation. Specifically, instead of such an arrangement in which the server 300 is configured to issue a license key, the information technology equipment 200 may be configured to access and log in to the website of the server 300 so as to apply for a license to use the program module 304 or the configuration data 306 every time the user uses the test system 2. In this case, in a case in which the user who applies for a license to use the program module 304 or the configuration data 306 has been registered in the database, and in a case in which the program module 304 or the configuration data 306 is not being used by the same user ID, the server 300 may be configured to license the user to use the program module 304 or the configuration data 306.

Also, instead of such an arrangement configured to download the test algorithm module 304a to the information technology equipment 200, an arrangement may be made in which the test program 240 is executed on the server 300. With such an arrangement, a part of or all of the components of the test control unit 210 are provided on the server 300 side, and a control command is transmitted to the tester hardware 100 via the information technology equipment 200.

Similarly, instead of such an arrangement configured to download the analysis tool module 304b to the information technology equipment 200, an arrangement may be made in which the test program 240 is executed on the server 300. With such an arrangement, a part of or all of the components of the test control unit 210 are provided on the server 300 side, and the data acquired by the tester hardware 100 is uploaded to the server 300 via the information technology equipment 200, and is processed by the server 300.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A tester hardware configured to supply a digital signal to a device under test and to receive a signal from the device under test according to a control signal from an information technology equipment, the tester hardware comprising:
   a control module configured to transmit/receive data between the control module and the information technology equipment, and to control each block of the tester hardware;
   a device power supply configured to generate a power supply voltage for the device under test;
   an internal power supply configured to generate a power supply voltage to be used in the tester hardware;
   a plurality of channels of tester pins;
   a plurality of drivers respectively provided for the channels, each of which is arranged such that a pattern signal is received via its input terminal, and a driver enable signal is received via its driver enable terminal, and each of which is configured such that, when the driver enable signal is asserted, the driver outputs a test pattern having a voltage level that corresponds to the pattern signal, and when the driver enable signal is negated, the output of the driver is set to a high-impedance state; a plurality of voltage comparators respectively provided for the channels, and each of which is configured to compare a voltage level of a digital signal input via a corresponding tester pin from the device under test with a predetermined high threshold voltage and a predetermined low threshold voltage;
   first rewritable memory configured to store first configuration data; and
   at least one first programmable device arranged such that it is connected to an input terminal of the first memory, respective input terminals of the plurality of drivers, respective enable terminals of the plurality of drivers, and respective output terminals of the plurality of voltage comparators, and configured such that its internal circuit information is defined according to the first configuration data stored in the first memory,
   wherein, in a state in which the first configuration data is loaded, internal components of the aforementioned at least one programmable device are configured so as to function as:
   (1) a plurality of latch circuits respectively provided for the voltage comparators, and each configured to latch an output signal of the corresponding voltage comparator at a timing of a strobe signal;
   (2) a plurality of digital comparators respectively provided for the latch circuits, and each configured to compare an output of the corresponding latch circuit with a corresponding expected value, and to generate a pass/fail signal which indicates whether or not the output agrees with the expected value;
   (3) a pattern generator configured to generate pattern data which defines the pattern signals to be respectively output to the plurality of drivers, the driver enable signals to be respectively output to the plurality of drivers, and the expected value data to be respectively output to the plurality of digital comparators;
   (4) a timing generator configured to generate a timing signal and the strobe signal; and
   (5) a format controller configured to receive the pattern data and the timing signal, and to generate the pattern signal having a level that corresponds to the pattern data, and having an edge timing that corresponds to the timing signal.

2. The tester hardware according to claim 1, wherein the pattern generator is configured to be capable of switching the pattern data generating method according to the first configuration data written to the first memory.

3. The tester hardware according to claim 2, wherein the pattern generator is configured to function as at least one of an SQPG (Sequential Pattern Generator), an ALPG (Algorithmic Pattern Generator), and an SCPG (Scan Pattern Generator), configured to operate according to the first configuration data.

4. The tester hardware according to claim 1, further comprising volatile memory,
   wherein, in a state in which the first configuration data is loaded, an internal component of the aforementioned at least one first programmable device is configured so as to function as a fail memory controller configured to instruct the volatile memory to store the pass/fail signals output from the plurality of digital comparators.

5. The tester hardware according to claim 1, further comprising:
   second rewritable memory configured to store second configuration data;

a plurality of first D/A converters configured to generate respective high power supply voltages for the plurality of drivers;

a plurality of second D/A converters configured to generate respective low power supply voltages for the plurality of drivers; and a second programmable device connected to the second memory and respective input terminals of the first and second D/A converters, and configured such that its internal circuit information is defined according to the second configuration data stored in the second memory, wherein, in a state in which the second configuration data is loaded, an internal component of the second programmable device is configured so as to function as a pin controller configured to output, to an input terminal of each first D/A converter, a control value which indicates a high-level voltage of the test pattern, and to output, to an input terminal of each second D/A converter, a control value which indicates a low-level voltage of the test pattern.

6. The tester hardware according to claim 5, further comprising:

a plurality of third D/A converters configured to generate respective high threshold voltages for the plurality of voltage comparators; and a plurality of fourth D/A converters configured to generate respective low threshold voltages for the plurality of voltage comparators, wherein the second programmable device is connected to the third and fourth D/A converters, and wherein the pin controller is configured to output, to input terminals of the third D/A converters, a control value which indicates the high threshold voltage, and to output, to input terminals of the second D/A converters, a control value which indicates the low level voltage of the test pattern.

7. The tester hardware according to claim 1, further comprising:

second rewritable memory configured to store second configuration data; and a second programmable device connected to the second memory and the device power supply, and configured such that its internal circuit information is defined according to the second configuration data stored in the second memory, wherein, in a state in which the second configuration data is loaded, an internal component of the second programmable device is configured so as to function as a device power supply controller configured to control the device power supply.

8. The tester hardware according to claim 1, further comprising:

second rewritable memory configured to store second configuration data;

a parametric measurement unit including a voltage source, a current source, an ammeter, and a voltmeter; and a relay switch group configured to assign the parametric measurement unit to a desired tester pin, wherein, in a state in which the second configuration data is loaded, an internal component of the second programmable device is configured so as to function as a DC controller configured to control the parametric measurement unit.

9. The tester hardware according to claim 1, further comprising:

second rewritable memory configured to store second configuration data;

an arbitrary waveform generator configured to generate an analog arbitrary waveform signal;

a second programmable device connected to the second memory and the arbitrary waveform generator, and configured such that its internal circuit information is defined according to the second configuration data stored in the second memory; and a relay switch group configured to assign the arbitrary waveform generator to a desired tester pin, wherein, in a state in which the second configuration data is loaded, an internal component of the second programmable device is configured so as to function as a waveform generator controller configured to control the arbitrary waveform generator.

10. The tester hardware according to claim 1, further comprising:

second rewritable memory configured to store second configuration data;

a digitizer configured to convert an analog voltage into a digital signal;

a second programmable device connected to the second memory and the digitizer, and configured such that its internal circuit information is defined according to the second configuration data stored in the second memory; and a relay switch group configured to assign the digitizer to a desired tester pin, wherein, in a state in which the second configuration data is loaded, an internal component of the second programmable device is configured so as to function as a digitizer controller configured to control the digitizer.

11. The tester hardware according to claim 1, wherein the control module is configured to instruct the pattern generator to start to generate the pattern data according to a control signal from the information technology equipment, and to notify the information technology equipment of the completion of generation of the pattern data when the control module detects the completion of the generation of the pattern data, and wherein, when the information technology equipment receives a notice of completion of generation of the pattern data, the information technology equipment reads out a pass/fail signal.

12. The tester hardware according to claim 1, wherein the device power supply, the internal power supply, the plurality of channels of tester pins, the plurality of drivers, the plurality of voltage comparators, the first memory, and the aforementioned at least one first programmable device form a single function module, and wherein the number of channels is changeable in units of the aforementioned function modules.

13. The tester hardware according to claim 12, wherein a bus is configured on each function module via the aforementioned at least one first programmable device, and wherein the plurality of function modules are configured to allow the respective buses to be connected in series.

14. The tester hardware according to claim 13, wherein the control module comprises:

a system controller;

an expansion port having an input terminal via which a signal is to be received from the exterior and an output terminal via which a signal is to be output to the exterior; and a selector configured to select a signal from among a signal input from the expansion port and a signal received from the system controller, and wherein the plurality of tester hardware are each configured so as to allow them to be connected in series.

15. A test system configured to test a device under test, comprising:
tester hardware; and
information technology equipment,
wherein the tester hardware is configured to supply a digital signal to the device under test and to receive a signal from the device under test according to a control signal from the information technology equipment, the tester hardware comprising:
a control module configured to transmit/receive data between the control module and the information technology equipment and to control each block of the tester hardware;
a device power supply configured to generate a power supply voltage for the device under test;
an internal power supply configured to generate a power supply voltage to be used in the tester hardware;
a plurality of channels of tester pins;
a plurality of drivers respectively provided for the channels, each of which is arranged such that a pattern signal is received via an input terminal, and a driver enable signal is received via a driver enable terminal, and each of which is configured such that when a driver enable signal is asserted, the driver outputs a test pattern having a voltage level that corresponds to the pattern signal, and when the driver enable signal is negated, the output of the driver is set to a high-impedance state;
a plurality of voltage comparators respectively provided for the channels, each of which is configured to compare a voltage level of a digital signal input via a corresponding tester pin from the device under test with a predetermined high threshold voltage and a predetermined low threshold voltage;
first rewritable memory configured to store a first configuration of data; and
at least one first programmable device arranged such that it is connected to an input terminal of the first memory, respective input terminals of the plurality of drivers, respective enable terminals of the plurality of drivers, and respective output terminals of the plurality of voltage comparators, and configured such that its internal circuit information is defined according to the first configuration data stored in the first memory,
wherein, in a state in which the first configuration data is loaded, internal components of the aforementioned at least one programmable device are configured so as to function as:
(1) a plurality of latch circuits respectively provided for the voltage comparators, each configured to latch an output signal of the corresponding voltage comparator at a timing of a strobe signal;
(2) a plurality of digital comparators respectively provided for the latch circuits, each configured to compare an output of the corresponding latch circuit with a corresponding expected value, and to generate a pass/fail signal which indicates whether or not the output agrees with the expected value;
(3) a pattern generator configured to generate pattern data which defines the pattern signals to be respectively output to the plurality of drivers, the driver enable signals to be respectively output to the plurality of drivers, the expected value data to be respectively output to the plurality of digital comparators;
(4) a timing generator configured to generate a timing signal and the strobe signal; and
(5) a format controller configured to receive the pattern data and the timing signal, and to generate the pattern signal having a level that corresponds to the pattern data, and having an edge timing that corresponds to the timing signal,
wherein the information technology equipment comprises:
(i) a data acquisition unit configured such that, when the test system is set up, the data acquisition unit acquires the configuration data suitable for test content specified by the user, from among a plurality of configuration data prepared for supplying various kinds of functions to the test system;
(ii) a hardware access unit configured to write the configuration data to the memory of the tester hardware; and
(iii) a test control unit configured to execute a test program when the device under test is tested, to control the tester hardware according to the test program, and to process data acquired by the tester hardware.

16. The test system according to claim 15, wherein, before the user uses the configuration data, a service provider that has a relation to the test system issues a first license key including identification information with respect to the configuration data to be licensed, and identification information with respect to the information technology equipment to be licensed to use the configuration data,
and wherein the hardware access unit is configured to be capable of acquiring information with respect to the configuration data stored in the memory of a currently connected tester hardware,
and wherein the information technology equipment further comprises:
a license key holding unit configured to hold the first license key; and
an authentication unit configured to judge whether or not the identification information with respect to the information technology equipment included in the first license key agrees with the identification information with respect to the information technology equipment mounting the license key holding unit when the license key holding unit holds the first license key including the identification information with respect to the configuration data,
and wherein, when the authentication unit succeeds in authentication with respect to the first license key, the first configuration data is loaded into the aforementioned at least one first programmable device.

* * * * *